(12) United States Patent
Molina et al.

(10) Patent No.: US 9,923,595 B2
(45) Date of Patent: Mar. 20, 2018

(54) DIGITAL PREDISTORTION FOR DUAL-BAND POWER AMPLIFIERS

(71) Applicant: Intel Corporation, Santa Clara, CA (US)

(72) Inventors: Albert Molina, Novelda (ES); Kameran Azadet, San Ramon, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/191,583

(22) Filed: Jun. 24, 2016

(65) Prior Publication Data

US 2016/0308577 A1 Oct. 20, 2016

Related U.S. Application Data

(63) Continuation of application No. PCT/EP2016/056810, filed on Mar. 29, 2016, and a
(Continued)

(51) Int. Cl.
*H04K 1/02* (2006.01)
*H04L 25/03* (2006.01)
(Continued)

(52) U.S. Cl.
CPC .............. *H04B 1/62* (2013.01); *G06F 17/50* (2013.01); *G06F 17/5009* (2013.01);
(Continued)

(58) Field of Classification Search
CPC ......... H04B 1/62; H04B 1/525; H03F 1/3241; G06F 17/50; G06F 17/5009;
(Continued)

(56) References Cited

U.S. PATENT DOCUMENTS 4,673,941 A  6/1987 Van Der Mark
4,884,265 A  11/1989 Schroeder et al.
(Continued)

FOREIGN PATENT DOCUMENTS

EP  2256937 A1  12/2010
KR  20050064485 A  6/2005
(Continued)

OTHER PUBLICATIONS

Lei Ding, Zigang Yang and H. Gandhi, "Concurrent dual-band digital predistortion," 2012 IEEE/MTT-S International Microwave Symposium Digest, Montreal, QC, Canada, 2012, pp. 1-3.*
(Continued)

*Primary Examiner* — Daniel Washburn
*Assistant Examiner* — Amneet Singh
(74) *Attorney, Agent, or Firm* — Viering, Jentschura & Partner mbB

(57) ABSTRACT

A signal processing circuit arrangement may include a preamplifier circuit configured to map a first dimension input and a second dimension input to a first subset of a plurality of lookup table coefficients of a two-dimensional (2D) lookup table, wherein the first dimension input and the second dimension input each represent a signal level of one or more input signals, extrapolate from the first subset of the plurality of lookup table coefficients to generate a lookup table output, and apply the lookup table output to the one or more input signals to generate a predistorted input signal for an amplifier.

22 Claims, 15 Drawing Sheets

Related U.S. Application Data continuation-in-part of application No. 14/230,607, filed on Mar. 31, 2014.

(60) Provisional application No. 61/812,858, filed on Apr. 17, 2013.

(51) Int. Cl.

| | | |
|---|---|---|
| H04L 25/49 | (2006.01) | |
| H04B 1/62 | (2006.01) | |
| H04L 27/36 | (2006.01) | |
| G06F 17/50 | (2006.01) | |
| H04B 1/525 | (2015.01) | |
| H04J 11/00 | (2006.01) | |
| H04L 5/14 | (2006.01) | |
| H03F 1/32 | (2006.01) | |
| H03F 3/24 | (2006.01) | |

(52) U.S. Cl.
CPC ............ *H03F 1/3241* (2013.01); *H03F 3/24* (2013.01); *H04B 1/525* (2013.01); *H04J 11/004* (2013.01); *H04L 5/1461* (2013.01); *H04L 25/03012* (2013.01); *H04L 25/03343* (2013.01); *H04L 27/367* (2013.01); *H04L 27/368* (2013.01)

(58) Field of Classification Search
CPC ............ H04L 5/1461; H04L 25/03012; H04L 25/03343; H04L 27/367; H04L 27/368; H04J 11/004
See application file for complete search history.

(56) References Cited

U.S. PATENT DOCUMENTS

| | | | |
|---|---|---|---|
| 5,276,633 A | 1/1994 | Fox et al. | |
| 5,381,357 A | 1/1995 | Wedgwood et al. | |
| 5,416,845 A | 5/1995 | Qun | |
| 5,596,600 A | 1/1997 | Dimos et al. | |
| 5,706,314 A | 1/1998 | Davis et al. | |
| 5,896,304 A | 4/1999 | Tiemann | |
| 5,949,831 A | 9/1999 | Coker et al. | |
| 6,118,832 A | 9/2000 | Mayrargue et al. | |
| 6,150,976 A | 11/2000 | Cooley | |
| 6,151,682 A | 11/2000 | van der Wal et al. | |
| 6,158,027 A | 12/2000 | Bush et al. | |
| 6,163,788 A | 12/2000 | Chen et al. | |
| 6,446,193 B1 | 9/2002 | Alidina et al. | |
| 6,529,925 B1 | 3/2003 | Schenk | |
| 6,574,649 B2 | 6/2003 | McGrath | |
| 6,580,768 B1 | 6/2003 | Jaquette | |
| 6,625,235 B1 | 9/2003 | Coker et al. | |
| 6,643,814 B1 | 11/2003 | Cideciyan et al. | |
| 6,801,086 B1 | 10/2004 | Chandrasekaran | |
| 6,996,378 B2 * | 2/2006 | Helms ................ | H03F 1/3247 375/296 |
| 7,039,091 B1 | 5/2006 | Mauer | |
| 7,110,477 B2 | 9/2006 | Suissa et al. | |
| 7,133,387 B2 | 11/2006 | Nakada | |
| 7,167,513 B2 | 1/2007 | Tsui et al. | |
| 7,313,373 B1 | 12/2007 | Laskharian et al. | |
| 7,336,730 B2 | 2/2008 | Auranen et al. | |
| 7,349,375 B2 | 3/2008 | Gerakoulis | |
| 7,441,105 B1 | 10/2008 | Metzgen | |
| 7,471,739 B1 | 12/2008 | Wright | |
| 7,477,634 B1 | 1/2009 | McKown | |
| 7,593,492 B1 | 9/2009 | Lande | |
| 7,606,292 B1 | 10/2009 | Harris et al. | |
| 7,613,228 B2 | 11/2009 | Niedzwiecki | |
| 7,656,837 B2 | 2/2010 | Gerakoulis | |
| 7,869,482 B2 | 1/2011 | Kubota et al. | |
| 7,895,252 B2 | 2/2011 | Sazegari et al. | |
| 8,516,028 B2 | 8/2013 | Yu | |
| 8,583,152 B2 | 11/2013 | Ishii et al. | |
| 8,711,988 B2 | 4/2014 | Chen | |
| 8,831,133 B2 | 9/2014 | Azadet et al. | |
| 8,897,388 B2 | 11/2014 | Molina et al. | |
| 8,982,992 B2 | 3/2015 | Azadet et al. | |
| 2001/0043582 A1 | 11/2001 | Nakada | |
| 2001/0050592 A1 | 12/2001 | Wright et al. | |
| 2001/0050926 A1 | 12/2001 | Kumar | |
| 2002/0057735 A1 | 5/2002 | Piirainen | |
| 2002/0062436 A1 | 5/2002 | Van Hook et al. | |
| 2002/0101835 A1 | 8/2002 | Gerakoulis | |
| 2003/0053552 A1 * | 3/2003 | Hongo ................ | H03F 1/3247 375/295 |
| 2003/0112904 A1 | 6/2003 | Fuller et al. | |
| 2003/0152165 A1 | 8/2003 | Kondo et al. | |
| 2003/0223505 A1 | 12/2003 | Verbin et al. | |
| 2003/0227981 A1 * | 12/2003 | Vella-Coleiro ....... | H04L 27/367 375/297 |
| 2004/0052314 A1 | 3/2004 | Copeland | |
| 2004/0120420 A1 * | 6/2004 | Hongo ................ | H03F 1/02 375/297 |
| 2004/0180679 A1 | 9/2004 | Porter | |
| 2004/0202137 A1 | 10/2004 | Gerakoulis | |
| 2004/0248516 A1 | 12/2004 | Demir et al. | |
| 2005/0001675 A1 | 1/2005 | Saed | |
| 2005/0036575 A1 | 2/2005 | Kuchi et al. | |
| 2005/0108002 A1 | 5/2005 | Nagai et al. | |
| 2005/0111574 A1 * | 5/2005 | Muller ................ | H03F 1/32 375/296 |
| 2005/0243946 A1 | 11/2005 | Chung et al. | |
| 2006/0029149 A1 | 2/2006 | Kim et al. | |
| 2006/0109938 A1 | 5/2006 | Challa et al. | |
| 2006/0176969 A1 | 8/2006 | Trivedi | |
| 2006/0198466 A1 | 9/2006 | Wright et al. | |
| 2006/0240786 A1 | 10/2006 | Liu | |
| 2006/0276146 A1 * | 12/2006 | Suzuki ................ | H03F 1/3252 455/114.3 |
| 2007/0005674 A1 | 1/2007 | Sazegari et al. | |
| 2007/0087770 A1 | 4/2007 | Gan | |
| 2007/0189402 A1 | 8/2007 | Yang | |
| 2008/0019422 A1 | 1/2008 | Smith et al. | |
| 2008/0027720 A1 | 1/2008 | Kondo et al. | |
| 2008/0056403 A1 | 3/2008 | Wilson | |
| 2008/0074155 A1 | 3/2008 | Jaklitsch | |
| 2008/0095265 A1 | 4/2008 | Cai et al. | |
| 2008/0107046 A1 | 5/2008 | Kangasmaa et al. | |
| 2008/0187057 A1 | 8/2008 | Qu | |
| 2008/0192860 A1 | 8/2008 | Harwood et al. | |
| 2008/0219220 A1 | 9/2008 | Gerakoulis | |
| 2008/0247487 A1 | 10/2008 | Cai et al. | |
| 2008/0267261 A1 | 10/2008 | Wang et al. | |
| 2008/0316076 A1 | 12/2008 | Dent et al. | |
| 2009/0006514 A1 | 1/2009 | Kountouris | |
| 2009/0029664 A1 | 1/2009 | Batruni | |
| 2009/0079627 A1 | 3/2009 | Sun et al. | |
| 2009/0116576 A1 | 5/2009 | Dowling | |
| 2009/0164542 A1 | 6/2009 | Wu et al. | |
| 2009/0225899 A1 | 9/2009 | Dent | |
| 2009/0245406 A1 | 10/2009 | Moffatt et al. | |
| 2009/0257421 A1 | 10/2009 | Nakashima et al. | |
| 2009/0285335 A1 | 11/2009 | Hoshuyama | |
| 2010/0027592 A1 | 2/2010 | Arviv et al. | |
| 2010/0067511 A1 | 3/2010 | Peters | |
| 2010/0098139 A1 | 4/2010 | Braithwaite | |
| 2010/0124257 A1 | 5/2010 | Yahya | |
| 2010/0144333 A1 | 6/2010 | Kiasaleh et al. | |
| 2010/0158051 A1 | 6/2010 | Hadzic et al. | |
| 2010/0198893 A1 | 8/2010 | Azadet et al. | |
| 2010/0198894 A1 | 8/2010 | Azadet et al. | |
| 2010/0225390 A1 * | 9/2010 | Brown ................ | H03F 1/3247 330/149 |
| 2010/0244953 A1 | 9/2010 | Brown et al. | |
| 2010/0246714 A1 | 9/2010 | Yang et al. | |
| 2010/0255867 A1 | 10/2010 | Ishii et al. | |
| 2010/0273427 A1 | 10/2010 | Mergen et al. | |
| 2010/0316112 A1 | 12/2010 | Huang et al. | |
| 2011/0002249 A1 | 1/2011 | Gerakoulis | |
| 2011/0007907 A1 | 1/2011 | Park et al. | |
| 2011/0019724 A1 | 1/2011 | Agazzi | |

(56) References Cited

U.S. PATENT DOCUMENTS

| | | | |
|---|---|---|---|
| 2011/0025414 A1 | 2/2011 | Wolf et al. | |
| 2011/0055303 A1 | 3/2011 | Slavin | |
| 2011/0059710 A1 | 3/2011 | Cai et al. | |
| 2011/0080902 A1 | 4/2011 | Jang | |
| 2011/0096824 A1 | 4/2011 | Agazzi et al. | |
| 2011/0150130 A1* | 6/2011 | Kenington | H03F 1/3247 375/296 |
| 2011/0170421 A1 | 7/2011 | Gerakoulis | |
| 2011/0255011 A1 | 10/2011 | Gu et al. | |
| 2011/0268167 A1 | 11/2011 | Sundstroem | |
| 2011/0302230 A1 | 12/2011 | Ekstrand | |
| 2012/0036174 A1 | 2/2012 | Yu | |
| 2012/0069931 A1* | 3/2012 | Gandhi | H03F 1/3247 375/296 |
| 2012/0087406 A1 | 4/2012 | Lim et al. | |
| 2012/0093209 A1 | 4/2012 | Schmidt et al. | |
| 2012/0106614 A1 | 5/2012 | Kim et al. | |
| 2012/0188994 A1 | 7/2012 | Palanki et al. | |
| 2012/0269293 A1* | 10/2012 | Peng | H04B 1/0475 375/297 |
| 2012/0280840 A1 | 11/2012 | Kyeong et al. | |
| 2012/0295657 A1 | 11/2012 | Okazaki | |
| 2013/0007082 A1 | 1/2013 | Elenes | |
| 2013/0022157 A1 | 1/2013 | Hollevoet et al. | |
| 2013/0044794 A1 | 2/2013 | Wenzel et al. | |
| 2013/0070867 A1 | 3/2013 | To et al. | |
| 2013/0114652 A1 | 5/2013 | Molina et al. | |
| 2013/0114761 A1 | 5/2013 | Azadet et al. | |
| 2013/0114762 A1 | 5/2013 | Azadet et al. | |
| 2013/0117342 A1 | 5/2013 | Azadet et al. | |
| 2013/0195007 A1 | 8/2013 | Mazurenko et al. | |
| 2013/0243123 A1* | 9/2013 | Bai | H04L 27/367 375/297 |
| 2014/0016626 A1 | 1/2014 | Dai et al. | |
| 2014/0064417 A1 | 3/2014 | Azadet | |
| 2014/0072073 A1 | 3/2014 | Azadet et al. | |
| 2014/0075162 A1 | 3/2014 | Azadet et al. | |
| 2014/0086356 A1 | 3/2014 | Azadet et al. | |
| 2014/0086367 A1 | 3/2014 | Azadet et al. | |
| 2014/0108477 A1 | 4/2014 | Azadet et al. | |
| 2014/0314176 A1 | 10/2014 | Azadet | |
| 2014/0314182 A1 | 10/2014 | Azadet | |
| 2014/0317163 A1 | 10/2014 | Azadet et al. | |
| 2015/0070089 A1 | 3/2015 | Eliaz et al. | |
| 2015/0146822 A1 | 5/2015 | Copeland | |

FOREIGN PATENT DOCUMENTS

| | | |
|---|---|---|
| WO | 2007010331 A1 | 1/2007 |
| WO | 2007104362 A1 | 9/2007 |
| WO | 2008057584 A2 | 5/2008 |
| WO | 2011058843 A1 | 5/2011 |
| WO | 2011101233 A1 | 8/2011 |
| WO | 2013007188 A1 | 1/2013 |
| WO | 2013063434 A1 | 5/2013 |
| WO | 2013063440 A1 | 5/2013 |
| WO | 2013063443 A1 | 5/2013 |
| WO | 2013063447 A2 | 5/2013 |
| WO | 2013063450 A1 | 5/2013 |
| WO | 2013066756 A2 | 5/2013 |

OTHER PUBLICATIONS

A. K. Kwan, S. A. Bassam, M. Helaoui and F. M. Ghannouchi, "Concurrent dual band digital predistortion using look up tables with variable depths," 2013 IEEE Topical Conference on Power Amplifiers for Wireless and Radio Applications, Santa Clara, CA, 2013, pp. 25-27.*

Notice of Allowance received for U.S. Appl. No. 14/168,615 dated Feb. 4, 2016, 7 pages.

Wegener, A.: "High-Performance Crest Factor Reduction Processor for W-CDMA and Applications", Radio Frequency Integrated Circuits (RFIC) Symposium, Jun. 2006, 4 pages, IEEE, USA.

Gopalan R. et al.: "An Optimization Approach to Single-Bit Quantization", IEEE Transaction on Circuits and Systems I: Regular Papers, Dec. 2009, pp. 2655-2668, vol. 56, Issue 12, IEEE, USA.

Gopalan R. et al.: "On an optimum algorithm for waveform synthesis and its applications to digital transmitters", Wireless Communications and Networking Conference, Mar. 2005, pp. 1108-1113, vol. 2, IEEE, USA.

Venkataraman J. et al: "An All-Digital Transmitter with a 1-Bit DAC", IEEE Transaction on Communications, Oct. 2007, pp. 1951-1962, vol. 55, Issue 10, IEEE, USA.

Li: "FIR Filtering Using Vector Transformation and Convolution Processor", 1990, IEEE, pp. 1223-1226.

Non-Final Office Action received for U.S. Appl. No. 14/255,491 dated Jun. 16, 2016, 11 pages.

Final Office Action received for U.S. Appl. No. 14/230,635 dated Jun. 30, 2016, 13 pages.

Final Office Action received for U.S. Appl. No. 14/230,607 dated Jun. 2, 2016, 17 pages.

Office Action received for the U.S. Appl. No. 14/230,607, dated Apr. 21, 2017, 29 pages.

Office Action received for the U.S. Appl. No. 14/255,499, dated Jun. 15, 2017, 60 pages.

International search report received for corresponding International Application No. PCT/EP2016/056810 dated Nov. 29, 2016, 15 pages.

Office Action received for corresponding U.S. Appl. No. 14/230,607 dated Oct. 7, 2016, 22 pages.

Kim et al., "Piecewise Pre-Equalized Linearization of the Wireless Transmitter With a Doherty Amplifier", IEEE Transactions on Microwave Theory and Techniques, 2006, pp. 3469-3478, vol. 54, No. 9.

Advisory Action received for the U.S. Appl. No. 14/230,607, dated Jul. 12, 2017, 3 pages.

Office Action received for the U.S. Appl. No. 14/230,607, dated Sep. 7, 2017, 31 pages.

Lei Ding, "Digital Predistortion of Power Amplifiers for Wireless Applications", School of Electrical and Computer Engineering Georgia Institute of Technology PhD thesis, Mar. 2004.

Maarten Schoukens et al., "Parametric Identification of Parallel Wiener Systems", IEEE Transactions on Instrumentation and Measurement, Oct. 2012, pp. 2825-2832, vol. 61, No. 10, IEEE.

Notice of Allowance received for the U.S. Appl. No. 14/255,499, dated Nov. 17, 2017, 17 pages.

* cited by examiner

DIGITAL PREDISTORTION FOR DUAL-BAND POWER AMPLIFIERS

CROSS-REFERENCE TO RELATED APPLICATION

This application is a continuation of International Application No. PCT/EP2016/056810, filed Mar. 29, 2016, and is also a continuation-in-part of U.S. patent application Ser. No. 14/230,607, filed Mar. 31, 2014, which claims the benefit of U.S. Provisional Application No. 61/812,858, filed Apr. 17, 2013.

TECHNICAL FIELD

Various embodiments relate generally to methods and devices for digital predistortion systems for dual-band power amplifiers.

BACKGROUND

Power Amplifiers (PAs) are used in a number of radio frequency (RF) transmission systems in order to amplify RF signals prior to wireless transmission, and accordingly may be essential for driving transmit antennas. However, PAs may suffer from non-linearity, which may in particular be accentuated when combined with complex modulation schemes that exhibit high Peak-to-Average Power Ratios (PAPR). Among other various solutions, Digital Predistortion (DPD) has been proposed as an effective and cost-efficient technique to counteract PA non-linearity. Such DPD systems may attempt to model the inverse of the PA response and apply this inverse model to input signals to the PA, which may in effect largely negate the non-linearity of the PA in order to produce a relatively linear overall response.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
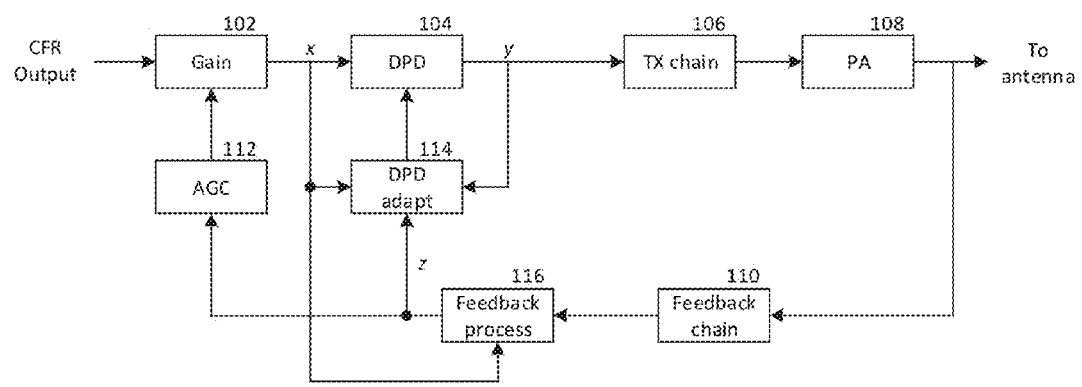
FIG. 1 shows a block diagram for a DPD system for a single-band power amplifier.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The words "plural" and "multiple" in the description and the claims expressly refer to a quantity greater than one. Accordingly, any phrases explicitly invoking the aforementioned words (e.g. "a plurality of [objects]", "multiple [objects]") referring to a quantity of objects expressly refers more than one of the said objects. The terms "group (of)", "set [of]", "collection (of)", "series (of)", "sequence (of)", "grouping (of)", etc., and the like in the description and in the claims, if any, refer to a quantity equal to or greater than one, i.e. one or more.

It is appreciated that any vector and/or matrix notation utilized herein is exemplary in nature and is employed solely for purposes of explanation. Accordingly, it is understood that the approaches detailed in this disclosure are not limited to being implemented solely using vectors and/or matrices, and that the associated processes and computations may be equivalently performed with respect to sets, sequences, groups, etc., of data, observations, information, signals, etc. Furthermore, it is appreciated that references to a "vector" may refer to a vector of any size or orientation, e.g. including a 1×1 vector (e.g. a scalar), a 1×M vector (e.g. a row vector), and an M×1 vector (e.g. a column vector). Similarly, it is appreciated that references to a "matrix" may refer to matrix of any size or orientation, e.g. including a 1×1 matrix (e.g. a scalar), a 1×M matrix (e.g. a row vector), and an M×1 matrix (e.g. a column vector).

A "circuit" as user herein is understood as any kind of logic-implementing entity, which may include special-purpose hardware or a processor executing software. A circuit may thus be an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions which will be described below in further detail may also be understood as a "circuit". It is understood that any two (or more) of the circuits detailed herein may be realized as a single circuit with substantially equivalent functionality, and conversely that any single circuit detailed herein may be realized as two (or more) separate circuits with substantially equivalent functionality. Additionally, references to a "circuit" may refer to two or more circuits that collectively form a single circuit.

As used herein, "memory" may be understood as a non-transitory computer-readable medium in which data or information can be stored for retrieval. References to "memory" included herein may thus be understood as referring to volatile or non-volatile memory, including random access memory (RAM), read-only memory (ROM), flash memory, solid-state storage, magnetic tape, hard disk drive, optical drive, etc., or any combination thereof. Furthermore, it is appreciated that registers, shift registers, processor registers, data buffers, etc., are also embraced herein by the term memory. It is appreciated that a single component referred to as "memory" or "a memory" may be composed of more than one different type of memory, and thus may refer to a collective component comprising one or more types of memory. It is readily understood that any single memory component may be separated into multiple collectively equivalent memory components, and vice versa. Furthermore, while memory may be depicted as separate from one or more other components (such as in the drawings), it is understood that memory may be integrated within another component, such as on a common integrated chip.

The term "base station" used in reference to an access point of a mobile communication network may be understood as a macro base station, micro base station, Node B, evolved NodeBs (eNB), Home eNodeB, Remote Radio Head (RRH), relay point, etc. As used herein, a "cell" in the context of telecommunications may be understood as a sector served by a base station. Accordingly, a cell may be a set of geographically co-located antennas that correspond to a particular sectorization of a base station. A base station may thus serve one or more cells (or sectors), where each cell is characterized by a distinct communication channel. Furthermore, the term "cell" may be utilized to refer to any of a macrocell, microcell, femtocell, picocell, etc.

For purposes of this disclosure, radio communication technologies may be classified as one of a Short Range radio communication technology, Metropolitan Area System radio communication technology, or Cellular Wide Area radio communication technology. Short Range radio communication technologies include Bluetooth, WLAN (e.g. according to any IEEE 802.11 standard), and other similar radio communication technologies. Metropolitan Area System radio communication technologies include Worldwide Interoperability for Microwave Access (WiMax) (e.g. according to an IEEE 802.16 radio communication standard, e.g. WiMax fixed or WiMax mobile) and other similar radio communication technologies. Cellular Wide Area radio communication technologies include GSM, UMTS, LTE, LTE-Advanced (LTE-A), CDMA, WCDMA, LTE-A, General Packet Radio Service (GPRS), Enhanced Data Rates for GSM Evolution (EDGE), High Speed Packet Access (HSPA), HSPA Plus (HSPA+), and other similar radio communication technologies. Cellular Wide Area radio communication technologies may be generally referred to herein as "cellular" communication technologies. It is understood that exemplary scenarios detailed herein are demonstrative in nature, and accordingly may be similarly applied to various other mobile communication technologies, both existing and not yet formulated, particularly in cases where such mobile communication technologies share similar features as disclosed regarding the following examples.

The term "network" as utilized herein, e.g. in reference to a communication network such as a mobile communication network, encompasses both an access section of a network (e.g. a radio access network (RAN) section) and a core section of a network (e.g. a core network section). The term "radio idle mode" or "radio idle state" used herein in reference to a mobile terminal refers to a radio control state in which the mobile terminal is not allocated at least one dedicated communication channel of a mobile communication network. The term "radio connected mode" or "radio connected state" used in reference to a mobile terminal refers to a radio control state in which the mobile terminal is allocated at least one dedicated uplink communication channel of a mobile communication network. Unless explicitly specified, the term "transmit" encompasses both direct and indirect transmission. Similarly, the term "receive" encompasses both direct and indirect reception unless explicitly specified.

Digital Predistortion (DPD) may be applied to an input signal of a Power Amplifier (PA) in order to "predistort" the input signal to compensate for nonlinearities of the PA. DPD may be thus used to linearize PAs found in various wireless transmission systems, and may be particularly applicable for implementation in base stations, remote radio heads (RRHs), and point-to-point backhaul links in cellular communication networks. DPD systems may rely on models of the PA response in order to provide a basis for generating the appropriate "predistorion" to apply to PA input signals.

PAs may conventionally be modeled using polynomials or splines (piece-wise polynomial functions) to characterize the non-linear response of various PAs. Polynomial-based DPD systems thus receive PA input signals and apply the polynomial functions of the model to PA input signals in order to produce the predistorted DPD outputs. Specifically, polynomial DPD systems may evaluate each of a set of complex polynomials given one or more input samples, apply the complex polynomial outputs as a complex gain factor to a function of the input samples, and sum the resulting samples to generate the DPD output. Assuming a suitable selection of complex modeling polynomials, the predistorted DPD outputs may represent the "inverse" of the actual nonlinearities of the PA, which may be substantially "canceled" when the DPD outputs are applied as input to the PA.

Polynomial DPD systems may either depend only on the current input sample, i.e. a memoryless polynomial model, or may depend the current input sample in addition to one or more past input samples, i.e. a polynomial model with memory. Such polynomial models may present the DPD model as the sum of a plurality of terms, where each term is the product of a function of the current and/or previous inputs and a complex polynomial that is a function of the magnitude of the current or a previous input. Accordingly, a DPD polynomial model may evaluate each of a set of complex polynomials at one or more input samples, apply each polynomial output as a gain factor to a function of one or more input samples, and sum the resulting products to produce the overall DPD output.

A DPD polynomial model may thus need to evaluate each of the set of complex polynomials in order to produce each DPD output sample. In order to reduce computational burden, polynomial DPD systems may utilize lookup tables (LUTs) to generate the DPD outputs. As opposed to directly evaluating each complex polynomial, DPD LUT systems may evaluate each of the complex polynomials over a wide domain of input samples and store the resulting outputs in a separate LUT, thus producing a separate LUT to represent each complex polynomial. DPD LUT systems may thus evaluate each LUT according to the received input samples and produce an LUT output value for each LUT. DPD LUT systems may then produce the DPD output by applying the LUT output values as a set of complex gains to the corresponding function of input samples, thus avoiding direct evaluation of each complex polynomial. Regardless, polynomial DPD models may suffer from accuracy issues, in particular for PA responses that exhibit discontinuities and other response features that are ill-suited for low-order polynomial modeling. Accordingly, polynomial DPD systems for such PAs may require high order polynomials that may be exceedingly complex and lead to numerical stability problems when estimating the polynomial coefficients.

In recognition of these deficiencies of polynomial DPD systems, an alternative solution may be realized by relying on direct estimation and adaptation of LUT coefficients, i.e. developing the LUT coefficients for each of the LUTs with an adaptation algorithm that adjusts the LUT coefficients for each LUT using feedback from the PA output. Accordingly, such direct LUT estimation may be based on actual PA input and output signals, and may be better suited to estimation of complex PA response in addition to being capable of capturing variations in the PA response over time, such as deviations caused by age, temperature, or other dynamic parameters.

FIG. 1 shows an exemplary realization of an LUT-based DPD system applied to a PA (PA 108). As shown in FIG. 1, gain circuit 102 may receive the digital output of a Crest Factor Reduction (CFR) circuit, which may limit the input signal to ensure a specific Peak-to-Average Power Ratio (PAPR, as further detailed below). Gain circuit 102 may apply a gain as specified by Automatic Gain Control (AGC) circuit 112 and provide the resulting signal to DPD circuit 104. As previously indicated, DPD circuit 104 may apply predistortion to the received signal in order to compensate for nonlinearities in PA 108. In recognition of the deficiencies detailed above, DPD circuit 104 may utilize one or more LUTs (where each LUT depends on the current input sample or a previous input sample) by receiving input samples of the input signal, identifying the corresponding LUT coefficients for each LUT, and providing an output sample according to the relevant LUT coefficients for each LUT. DPD circuit 104 may provide the predistorted output signal to transmit (TX) chain 106, which may include a digital-to-analog converter (DAC) to convert the digital output samples of DPD circuit 104 to produce an analog signal, a radio frequency (RF) modulator to modulate the resulting analog signal onto a radio carrier frequency, and other transmit chain circuitry to prepare the output signal for input to PA 108. PA 108 may receive the analog radio frequency and apply high-power amplification to render an output signal suitable for subsequently driving transmitter antennas. The system of FIG. 1 may be embodied in the Digital Front End (DFE) and radio transmitter (TX) sections of a wireless transmission system.

As previously indicated, DPD circuit 104 may utilize adaptable LUTs that dynamically adjust the LUT coefficients for each LUT based on feedback from the output of PA 108. Accordingly, feedback chain 110 may capture the analog, radio-frequency output of PA 108 and perform demodulation to recover a baseband (or intermediate frequency) and subsequent analog-to-digital conversion (ADC, with an ADC circuit) to produce digital, baseband samples representative of the output of PA 108. Feedback processing circuit 116 may receive these samples and perform gain adjustment and timing and phase alignment relative to the DPD input samples, which feedback processing circuit 116 may receive from the input node to DPD circuit 104. Feedback processing circuit 116 may provide the resulting feedback information to DPD adaptation circuit 114 and AGC circuit 112. AGC circuit 112 may apply the feedback information to adjust the gain control signal supplied to gain circuit 102 in accordance with automatic gain control procedures.

DPD adaptation circuit 114 may be responsible for performing adaptation of the LUT coefficients at DPD circuit 104, and accordingly may utilize the feedback information provided by feedback processing circuit 116 in order to evaluate the output of PA 108. Accordingly, DPD adaptation circuit 114 may attempt to correct for any inaccuracies in the LUT coefficients that are observable through nonlinearities detected in the output of PA 108. As further detailed below, DPD adaptation circuit 114 may employ an adaptation scheme such as Least Squares (LS) based on either indirect or direct learning to adapt the LUT coefficients of DPD circuit 104. DPD circuit 104 may thus dynamically adapt the LUT coefficients over time based on observations of the output of PA 108, and accordingly may be able to develop a highly-accurate model of PA 108 in order to subsequently yield linear performance at PA 108 with the assistance of the applied predistortion.

In particular for a single-band PA, DPD circuit 104 employ one-dimensional (1D) LUTs to produce the predistorted output samples that are subsequently supplied to PA 108. As previously indicated above regarding memory models, DPD circuit 104 may realize one or more LUTs according to a memory depth M, where each of the LUTs produces an LUT output based on the current or a past input sample. DPD circuit 104 may then produce the DPD output by applying each LUT output as a complex gain to the corresponding LUT function of input samples and summing the resulting products to obtain the DPD output. For the 1D LUT case, DPD circuit 104 may receive a sequence of complex baseband samples, calculate the magnitude of each complex baseband sample, and, for each of the corresponding 1D LUTs, map the magnitude value for the appropriate baseband sample to the 1D LUT to produce a complex-valued LUT output. DPD circuit 104 may then apply each LUT output as a complex gain factor to the corresponding function of baseband samples and sum the resulting samples to obtain the DPD output.

Each of the 1D LUTs may be defined as a sequence of evenly-spaced LUT coefficients positioned along a one-dimensional axis at multiples of an LUT spacing $\delta$. DPD circuit 104 may then determine each LUT output by mapping an input magnitude to the evenly-spaced grid of LUT coefficients and applying one or more proximate LUT coefficients to generate the LUT output. Each LUT coefficient may be a complex number, and accordingly DPD circuit 104 may produce a complex baseband DPD output sample from each complex baseband input samples received from gain circuit 102.

As each LUT coefficient is located at a discrete point (some multiple of $\delta$) on the one-dimensional axis of the corresponding 1D LUT, input magnitudes may probabilistically not fall exactly at an LUT coefficient. Accordingly, DPD circuit 104 may apply linear interpolation to calculate the LUT outputs for each LUT, where each resulting LUT output may be a linear combination of e.g. the two closest LUT coefficients to the respective input magnitude (i.e. the two LUT coefficients located on each side of the input magnitude if viewed on a 1D grid). As each 1D LUT is limited to some finite size N (i.e. the number of LUT coefficients), high input values may fall outside of the domain of LUT coefficients. In recognition thereof, DPD circuit 104 may apply linear extrapolation for input values that fall outside of the LUT coefficient domain.

DPD circuit 104 may represent each 1D LUT as a function $f_\Phi(x)$ that is defined as a linear combination of basis functions, where each basis function corresponds to an individual LUT coefficient and provides a respective contribution to LUT output $f_\Phi(x)$. LUT output function $f_\Phi(x)$ may be expressed as follows:

$$f_\Phi(x) = \sum_{i=0}^{N-1} \varphi_i \Lambda_{g(i,N)}(x - i\delta) \; x \geq 0 \quad (1)$$

where $\varphi_i$ are the LUT coefficients. The LUT coefficients $\varphi_i$ for each LUT may be complex, thus producing complex LUT outputs $f_\Phi(x)$.

Figure 2:
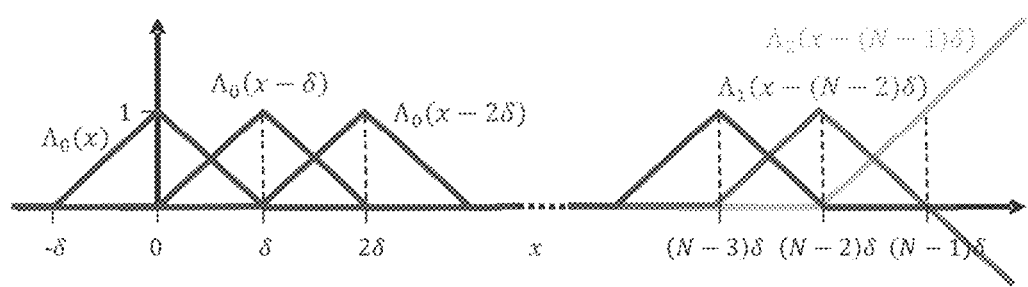
FIG. 2 shows 1-dimensional basis functions for linear interpolation and extrapolation.

FIG. 2 shows basis functions $\Lambda_{g(i,N)}(x)$ positioned at incremented multiples of LUT spacing $\delta$. As DPD circuit 104 utilizes a magnitude (of a complex baseband input sample) as input to each 1D LUT, the LUT input values x may be positive real numbers, thus limiting the LUT coefficient positions to $0 \leq x \leq (N-1)\delta$ where N is the LUT size, i.e. the number of LUT coefficients. The basis functions $\Lambda_{g(i,N)}(x)$ may be mathematically defined as follows:

$$g(i, N) = \begin{cases} 0 & i < N-2 \\ 1 & i = N-2 \\ 2 & i = N-1 \end{cases} \quad (2)$$

$$\Lambda_0(x) = \left(1 - \frac{|x|}{\delta}\right) w\left(\frac{|x|}{\delta}\right) \quad (3)$$

$$\Lambda_1(x) = \left(1 - \frac{|x|}{\delta}\right) u(x + \delta) \quad (4)$$

$$\Lambda_2(x) = \left(1 + \frac{|x|}{\delta}\right) u(x + \delta) \quad (5)$$

$$w(x) = \begin{cases} 1 & 0 \leq x \leq 1 \\ 0 & \text{otherwise} \end{cases} \quad (6)$$

$$u(x) = \begin{cases} 1 & x \geq 0 \\ 0 & \text{otherwise} \end{cases} \quad (7)$$

Accordingly, DPD circuit 104 may apply basis functions $\Lambda_{g(i,N)}(x)$ as defined in Equations (1)-(7) to produce a complex LUT output $f_\Phi(x)$ (for each of the 1D LUTs) for an input $x \geq 0$ where the output $f_\Phi(x)$ is the linear interpolation of the two nearest LUT values ("surrounding" the input x on a 1D grid) for $0 \leq x \leq (N-1)\delta$ and the linear extrapolation of $\varphi_{N-2}$ and $\varphi_{N-1}$ for $x > (N-1)\delta$. DPD circuit 104 may then produce the complex predistorted output y from $f_\Phi(x)$ (as will be further detailed regarding the 2D LUT implementation). DPD adaptation circuit 114 may receive processed feedback information z from feedback processing circuit 116 that characterizes the output of PA 108, where z may be time-aligned and gain-adjusted according to DPD inputs x. Dependent on the observed output of PA 108, DPD adaptation circuit 114 may then adapt the LUT coefficients $\varphi_i$ for each LUT (where each LUT corresponds to the current or a past input sample), thus altering LUT output $f_\Phi(x)$ in order to compensate for remaining nonlinearities in the response of PA 108.

The 1D LUT implementation detailed above for DPD circuit 104 may be suitable for single-band PAs, i.e. PAs that target a single transmission frequency band for amplification. However, the recent introduction of "dual-band" PAs (and accompanying RF chains) that service two transmission bands that are substantially separated in spectrum may pose substantial problems in DPD design. As the targeted bands may be separated by up to e.g. 400 MHz in spectrum, a candidate DPD system may need to accurately apply predistortion over a massive range of frequencies. Effective solutions that rely on a single DPD system may be exceptionally complex and expensive.

In recognition thereof, a dual-band DPD system targeting a dual-band PA may be realized that applies predistortion based on modeling the PA response as a non-linear function of two complex baseband variables, i.e. one each per targeted band of the PA. As introduced above regarding 1D LUTs, conventional schemes may utilize polynomial- or spline-based models for estimating the PA response and subsequently applying predistortion to input signals. The accuracy and complexity issues noted above regarding these solutions may similarly lead to sub-optimal LUT coefficients.

Figure 3:
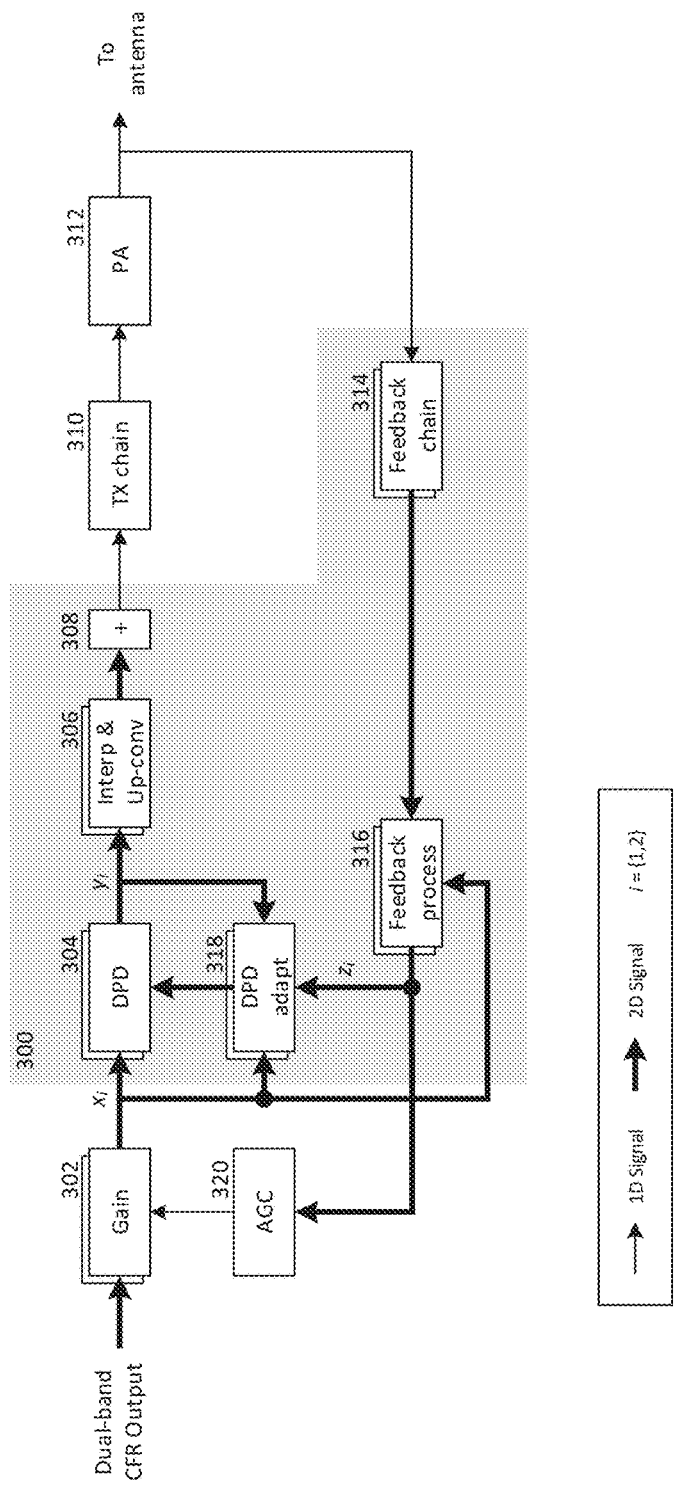
FIG. 3 shows a block diagram for a DPD system for a dual-band power amplifier.

Accordingly, a dual-band DPD system may rely on 2D LUTs that produce a complex output given the magnitude of a complex baseband input sample of each band as the two LUT inputs. FIG. 3 illustrates such a dual-band DPD system that may employ two DPD circuits 304a and 304b (collectively depicted in FIG. 3 as "304") to apply predistortion to the input of dual-band PA 312. As opposed to utilizing a single DPD block, DPD system 300 may instead apply a separate DPD block (304a and 304b, each executing one or more 2D LUTs) to target the first band and second band and subsequently combine both results to obtain a signal having appropriate predistortion at both the first and second bands. Instead of employing wideband DPD across the first and second bands in addition to the intervening spectrum, DPD system 300 may thus instead apply two separate narrowband DPD blocks (one to each band). In particular for frequency bands that are separated by a large intervening band, such dual-band DPD may be considerably less complex and more cost-efficient than a single wideband DPD block.

As shown in FIG. 3, gain circuits 302a and 302b may each receive a respective signal following crest-factor reduction, where each signal respectively corresponds to the first and second band. Each of gain circuits 302a and 302b may then apply the appropriate gain to the respective inputs as specified by AGC circuit 320, which may supply both gain circuit 302a and 302b with a common gain control signal. Gain circuits 302a and 302b may then provide $x_1$ and $x_2$ as input to DPD circuits 304a and 304b.

Figure 4:
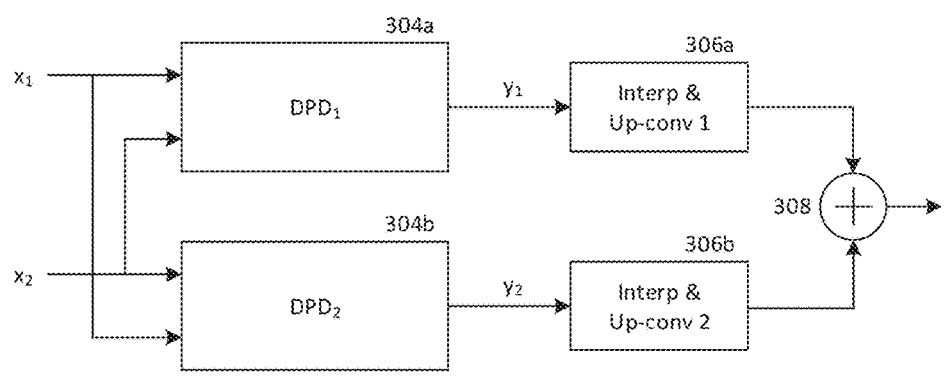
FIG. 4 shows a block diagram illustrating DPD circuits, interpolation and upconversion circuits, and an adding circuit for a dual-band DPD system.

As shown in FIG. 4, DPD circuits 304a and 304b may each receive both $x_1$ (sequence of complex baseband samples for the first band) and $x_2$ (sequence of complex baseband samples for the second band), and apply predistortion according to a respective set of 2D LUTs to the samples $x_1$ and $x_2$ to produce complex baseband output sequences $y_1$ and $y_2$, respectively. As detailed above in the 1D DPD case, the complex baseband outputs samples of $y_1$ and $y_2$ may each depend on one or more of the current or past samples of $x_1$ and $x_2$. As further detailed below, DPD circuits 304a and 304b may each apply one or more 2D LUTs with $|x_1|$ and $|x_2|$ as input to each produce resulting 2D LUT outputs $f_{\Phi,1}(|x_1|, |x_2|)$ and $f_{\Phi,2}(|x_1|, |x_2|)$ for each 2D LUT as a non-linear function of $|x_1|$ and $|x_2|$. DPD circuits 304a and 304b may then respectively produce $y_1$ and $y_2$ by applying the respective 2D LUT outputs as complex gains to the corresponding functions of input samples of $x_1$ and $x_2$ and generating $y_1$ and $y_2$ as the sum of the resulting samples.

The outputs $y_1$ and $y_2$ of DPD circuits 304a and 304b may remain "split", i.e. one output ($y_1$) for the first band and another output ($y_2$) for the second band. As PA 312 receives a single waveform, DPD system 300 may combine $y_1$ and $y_2$ into a single signal, thus including both predistorted outputs $y_1$ and $y_2$ into a single output for provision to PA 312. Accordingly, DPD system 300 may employ interpolation and up-conversion circuits 306a and 306b to up-sample and modulate both $y_1$ and $y_2$ to the appropriate intermediate frequencies (dependent on the spectral placement of the first and second bands) and combine the resulting upsampled signals with combining circuit 308. Combining circuit 308 may supply the combined signal to TX chain 310 for DAC and radio frequency modulation, which may subsequently provide the resulting signal to PA 312 for amplification. Accordingly, DPD system 300 may separately apply predistortion to both bands (as a function of the signals of both bands) and may operate DPD circuits 304a and 304b at substantially reduced sampling rates compared to a wideband DPD solution.

In order to provide AGC and LUT coefficient adaptation, feedback chain 314 may thus demodulate, digitize, and separate the first and second frequency band signals from the output of PA 312 and provide the resulting split digital baseband samples to feedback process circuit 316 for gain adjustment and timing and phase alignment. Feedback process circuit 316 may provide the digital baseband PA outputs $z_i$ to AGC circuit 320 for gain control at gain circuits 302 on subsequent inputs to DPD system 300.

Feedback process circuit 316 may also provide $z_i$ to DPD adaptation circuits 318a and 318b, which may be responsible for LUT coefficient adaptation of each of the respective 2D LUTs of DPD circuits 304a and 304b. As will be further detailed, DPD adaptation circuits 318a and 318b may apply LS estimation using direct or indirect learning to adapt the LUT coefficients of DPD circuits 304a and 304b based on the observed digital baseband PA outputs $z_i$.

DPD circuits 304a and 304b may thus employ 2D LUTs to generate $y_1$ and $y_2$ based on $|x_1|$ and $|x_2|$, where each of the respective 2D LUTs of DPD circuits 304a and 304b may each utilize distinct LUT coefficients. The 2D LUT function of each 2D LUT may be generalized as $f_\Phi(x_1, x_2)$ where $x_1$ and $x_2$ are positive real numbers. Each of DPD circuits 304a and 304b may produce $f_\Phi(x_1, x_2)$ for each of the 2D LUTs as the linear combination of $N_1N_2$ basis functions, where $N_1 \times N_2$ gives the LUT dimensions. The $N_1N_2$ LUT coefficients $\varphi$ may be represented by parameter vector $\overline{\Phi} = [\varphi_{0,0} \cdots \varphi_{0,N_2-1} \cdots \varphi_{N_1-1,N_2-1}]^T$, where each basis function of $f_\Phi(x_1, x_2)$ corresponds to a respective LUT coefficient and is located on an 2D grid spaced in one dimension (e.g. arbitrarily horizontal or vertical) according to LUT spacing $\delta_1$ and the other dimension according to LUT spacing $\delta_2$.

The 2D LUTs of DPD circuits 304a and 304b may apply interpolation and extrapolation to produce output $f_\Phi(x_1, x_2)$ given an input point ($x_1$, $x_2$). As previously indicated regarding the 1D LUT case, each 2D LUT may be of finite dimension $N_1 \times N_2$, where $N_1$ and $N_2$ denote the dimensions of the 2D LUT in the $x_1$ and $x_2$ directions, respectively. Accordingly, each 2D LUT may apply interpolation in both the $x_1$ and $x_2$ directions for certain domains of ($x_1$, $x_2$) while applying extrapolation in one or both the $x_1$ and $x_2$ directions for other domains of ($x_1$, $x_2$). Each 2D LUT may mathematically apply these differing interpolation and extrapolation regions by assigning specific basis functions to the LUT coefficients based on the location of each LUT coefficient within the 2D LUT.

Figure 5:
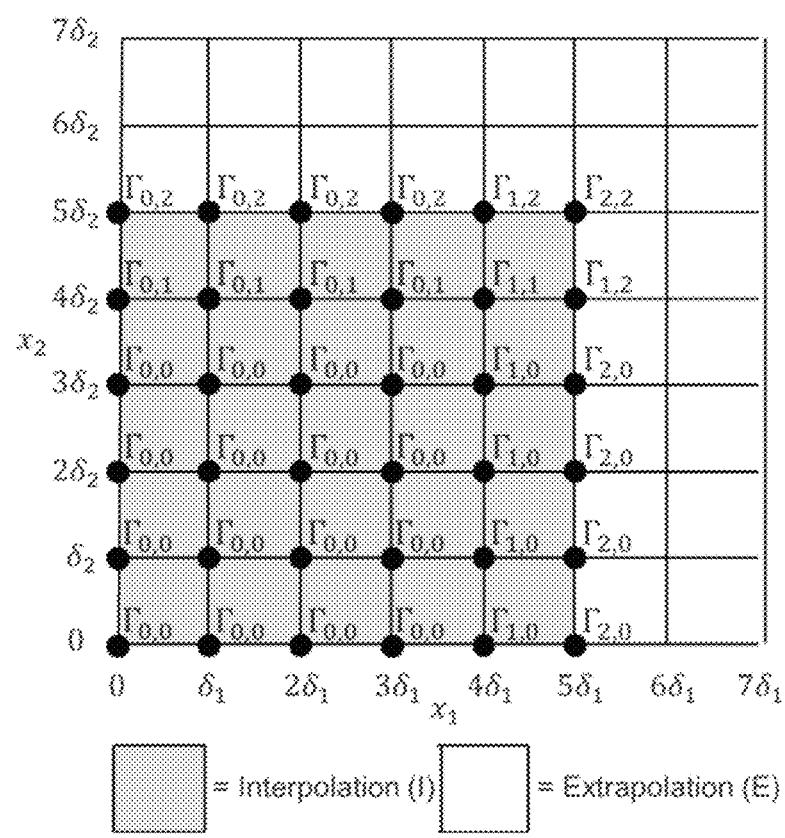
FIG. 5 shows a projection of the 2-dimensional domain of a 2-dimensional lookup table.

FIG. 5 shows an exemplary depiction of a 2D LUT with $N_1=N_2=6$ projected onto a two-dimensional grid with LUT spacing $\delta_1$ in the $x_1$ direction and $\delta_2$ in the $x_2$ direction. As depicted in FIG. 5, the 2D LUT may be composed of $N_1N_2$ total basis functions where each basis function is selected from one of nine possible basis functions $\Gamma_{i,j}$ for i,j=0, 1, 2. Each output $f_\Phi(x_1, x_2)$ of the 2D LUT may be a linear combination of the $N_1N_2$ basis functions at any point of the LUT. Dependent on a given input point ($x_1$, $x_2$), the selected basis functions (as defined below) may apply a linear interpolation and/or extrapolation to yield $f_\Phi(x_1, x_2)$.

The interpolation region shown in FIG. 5 may be defined as $0 \leq x_2 \leq (N_1-1)\delta_1$ and $0 \leq x_2 \leq (N_2-1)\delta_2$, where the overall interpolation region is composed of multiple inner rectangular regions each defined as $i\delta_1 \leq x_1 \leq (i+1)\delta_1$ and $j\delta_2 \leq x_2 \leq (x_2+1)\delta_2$ for i=0 ... $N_1-2$ and j=0 ... $N_2-2$. In each of these inner interpolation regions, $f_\Phi(x_1, x_2)$ may be obtained as the bilinear interpolation amongst the four corner points ($i\delta_1$, $j\delta_2$, $\varphi_{i,j}$), (($i+1)\delta_1$, $j\delta_2$, $\varphi_{i+1,j}$), ($i\delta_1$, ($j+1)\delta_2$, $\varphi_{i,j+1}$), and (($i+1)\delta_1$, ($j+1)\delta_2$, $\varphi_{i+1,j+1}$), where each corner point is an LUT grid point respectively corresponding to LUT coefficients $\varphi_{i,j}$, $\varphi_{i+1,j}$, $\varphi_{i,j+1}$ and $\varphi_{i+1,j+1}$ and the connected basis functions.

Figure 6:
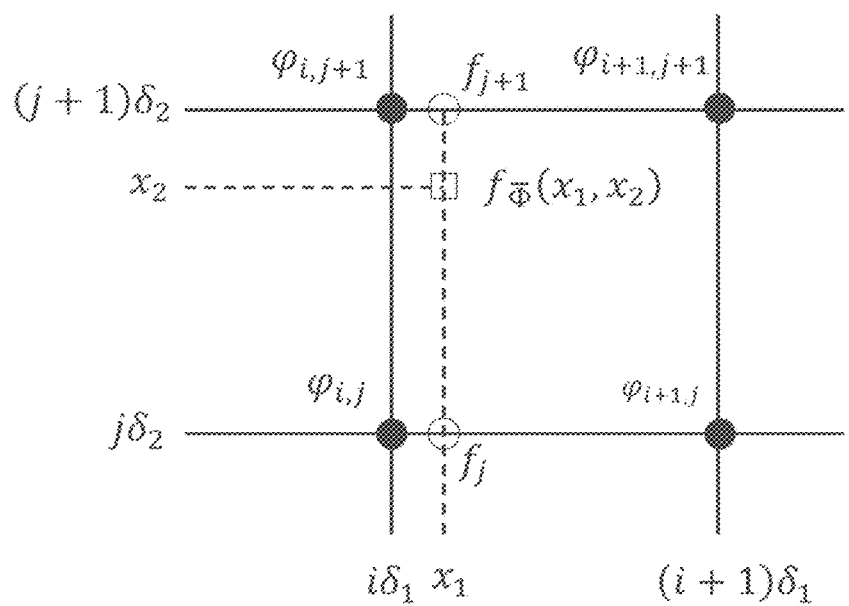
FIG. 6 shows an illustration of bilinear interpolation.

Such bilinear interpolation is demonstrated in FIG. 6, where bilinear interpolation is performed by first linearly interpolating between the points in the $x_1$ direction to produce $f_j$ and $f_{j+1}$ and then in the $x_2$ direction to produce the final result. This operations may be expressed mathematically as $$f_j = \varphi_{i,j} + (\varphi_{i+1,j} - \varphi_{i,j})\frac{x_1 - i\delta_1}{\delta_1} \tag{8}$$

$$f_{j+1} = \varphi_{i,j+1} + (\varphi_{i+1,j+1} - \varphi_{i,j+1})\frac{x_1 - i\delta_1}{\delta_1} \tag{9}$$

$$f_\Phi(x_1, x_2) = f_j + (f_{j+1} - f_j)\frac{x_2 - j\delta_2}{\delta_2} \tag{10}$$

Equations (8)-(10) may be re-written to show the contribution of each LUT point to $f_\Phi(x_1, x_2)$ as $$f_\Phi(x_1, x_2) = \left(1 - \frac{x_1 - i\delta_1}{\delta_1}\right)\left(1 - \frac{x_2 - j\delta_2}{\delta_2}\right)\varphi_{i,j} + \tag{11}$$
$$\left(1 + \frac{x_1 - (i-1)\delta_1}{\delta_1}\right)\left(1 - \frac{x_2 - j\delta_2}{\delta_2}\right)\varphi_{i+1,j} +$$
$$\left(1 - \frac{x_1 - i\delta_1}{\delta_1}\right)\left(1 + \frac{x_2 - (j+1)\delta_2}{\delta_2}\right)\varphi_{i,j+1} +$$
$$\left(1 + \frac{x_1 - (i+1)\delta_1}{\delta_1}\right)\left(1 + \frac{x_2 - (j+1)\delta_2}{\delta_2}\right)\varphi_{i+1,j+1}$$

LUT coefficient point ($i\delta_1$, $j\delta_2$, $\varphi_{i,j}$) will also provide a contribution to $f_\Phi(x_1, x_2)$ on the three other neighboring regions. The contribution of each LUT point ($i\delta_1$, $j\delta_2$, $\varphi_{i,j}$) (for i=0 ... $N_1-2$ and j=0 ... $N_2-2$) to each neighboring region for a given $x_1$ and $x_2$ is thus $$\left(1 - \frac{x_1 - i\delta_1}{\delta_1}\right)\left(1 - \frac{x_2 - j\delta_2}{\delta_2}\right)\varphi_{i,j} \begin{cases} i\delta_1 \leq x_1 \leq (i+1)\delta_1 \\ j\delta_2 \leq x_2 \leq (j+1)\delta_2 \end{cases} \tag{12}$$

$$\left(1 - \frac{x_1 - i\delta_1}{\delta_1}\right)\left(1 - \frac{x_2 - j\delta_2}{\delta_2}\right)\varphi_{i,j} \begin{cases} i\delta_1 \leq x_1 \leq (i+1)\delta_1 \\ (j-1)\delta_2 \leq x_2 \leq J\delta_2 \end{cases} \tag{13}$$

-continued $$\left(1 - \frac{x_1 - i\delta_1}{\delta_1}\right)\left(1 - \frac{x_2 - j\delta_2}{\delta_2}\right)\varphi_{i,j} \begin{cases} (i-1)\delta_1 \leq x_1 \leq i\delta_1 \\ j\delta_2 \leq x_2 \leq (J+1)\delta_2 \end{cases} \quad (14)$$

$$\left(1 - \frac{x_1 - i\delta_1}{\delta_1}\right)\left(1 - \frac{x_2 - j\delta_2}{\delta_2}\right)\varphi_{i,j} \begin{cases} (i-1)\delta_1 \leq x_1 \leq i\delta_1 \\ (j-1)\delta_2 \leq x_2 \leq j\delta_2 \end{cases} \quad (15)$$

The total contribution of $(i\delta_1, j\delta_2, \varphi_{i,j})$ to $f_{\overline{\varphi}}(x_1, x_2)$ may thus be expressed as $\varphi_{i,j}\Gamma_{0,0}(x_1, x_2)$ where $$\Gamma_{0,0}(x_1,x_2)=\Lambda_0(x_1)\Lambda_0(x_2) \quad (16)$$

with $\Lambda_0(x)$ as defined above in Equation (3).

Figure 7A:
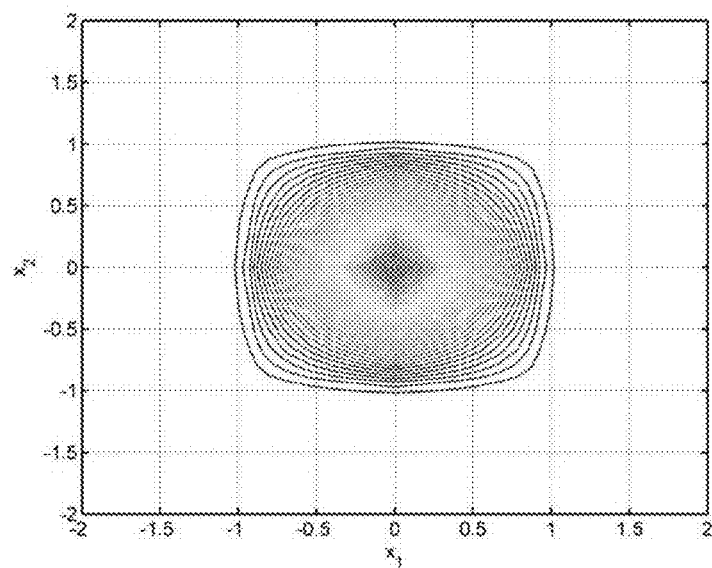
FIGS. 7A and 7B show a contour and mesh plot for a bilinear interpolation basis function of a 2-dimensional lookup table.
Figure 7B:
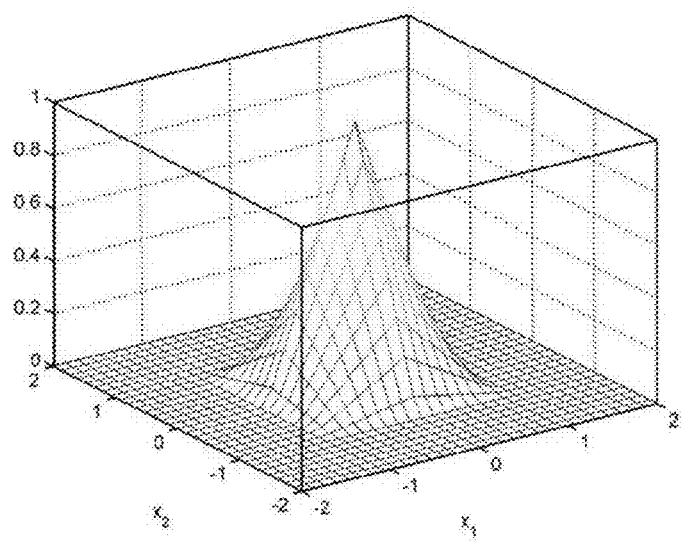

Accordingly, the bilinear interpolation function $\Gamma_{0,0}(x_1, x_2)$ is the product of the 1D linear interpolation functions for the 1D LUT case. The contour and 3D mesh plots for bilinear interpolation function $\Gamma_{0,0}(x_1, x_2)$ are shown in FIGS. 7A and 7B.

The LUT function defined for $0 \leq x_1 \leq (N_1-1)\delta_1$ and $0 \leq x_2 \leq (N_2-1)\delta_2$ (the bilinear interpolation region) may thus be defined as follows:

$$f_{\overline{\varphi}}(x_1, x_2) = \sum_{i=0}^{N_1-1}\sum_{j=0}^{N_2-1} \varphi_{i,j}\Gamma_{0,0}(x_1 - i\delta_1, x_2 - j\delta_2) \quad (17)$$

$$= \sum_{i=0}^{N_1-1}\sum_{j=0}^{N_2-1} \varphi_{i,j}\Lambda_0(x_1 - i\delta_1)\Lambda_0(x_2 - j\delta_2)$$

2D LUT output function $f_{\overline{\varphi}}(x_1, x_2)$ defined for the bilinear interpolation region in Equation (17) may be capable of providing a constant gain with zero error, i.e. may be able to produce a completely linear response. Specifically, by setting all $\varphi_{i,j}=1$ (or any other constant) for $0 \leq i \leq N_1$ and $0 \leq j \leq N_2$, $f_{\overline{\varphi}}(x_1, x_2)$ may generate a flat horizontal surface over the entire domain. Specifically, setting $\varphi_{i,j}=1$ in Equation (11) yields $$f_{\overline{\varphi}}(x_1, x_2) = \quad (18)$$
$$\left(1 - \frac{x_1 - i\delta_1}{\delta_1}\right)\left(1 - \frac{x_2 - j\delta_2}{\delta_2}\right) + \left(1 + \frac{x_1 - (i-1)\delta_1}{\delta_1}\right)\left(1 - \frac{x_2 - j\delta_2}{\delta_2}\right) +$$
$$\left(1 - \frac{x_1 - i\delta_1}{\delta_1}\right)\left(1 + \frac{x_2 - (j+1)\delta_2}{\delta_2}\right) +$$
$$\left(1 + \frac{x_1 - (i-1)\delta_1}{\delta_1}\right)\left(1 + \frac{x_2 - (j+1)\delta_2}{\delta_2}\right) =$$
$$\left(1 - \frac{x_2 - j\delta_2}{\delta_2}\right) + \left(1 + \frac{x_2 - (j+1)\delta_2}{\delta_2}\right) = 1$$

which holds for each inner rectangular region $i\delta_1 \leq x_1 \leq (i+1)\delta_1$ and $j\delta_2 \leq x_2 \leq (j+1)\delta_2$ over all $0 \leq i \leq N_1-2$ and $0 \leq j \leq N_2-2$.

Accordingly, $f_{\overline{\varphi}}(x_1, x_2)$ as defined above for the bilinear interpolation region may be well-suited for input points $(x_1, x_2)$ to DPD circuits 304a and 304b that fall within $0 \leq x_1 \leq (N_1-1)\delta_1$ and $0 \leq x_2 \leq (N_2-1)\delta_2$. However, in particular due to the potential scaling effects of gain circuits 302a and 302b, $x_1$ and $x_2$ may not be strictly bound to within such domains. Similarly to as detailed above regarding the 1D LUT case, DPD circuits 304a and 304b may additionally employ linear extrapolation to generate $f_{\overline{\varphi}}(x_1, x_2)$ for inputs that fall outside of the bilinear interpolation region.

Specifically, the overall LUT function $f_{\overline{\varphi}}(x_1, x_2)$ for all $x_1 \geq 0$ and $x_2 \geq 0$ may be given as $$f_{\overline{\varphi}}(x_1, x_2) = \sum_{i=0}^{N_1-1}\sum_{j=0}^{N_2-1} \varphi_{i,j}\Gamma_{g(i,N_1),(j,N_2)}(x_1 - i\delta_1, x_2 - j\delta_2) \quad (19)$$

where $$\Gamma_{i,j}(x_1,x_2)=\Lambda_i(x_1)\Lambda_j(x_2) \quad (20)$$

with $\Lambda_i(x)$ and $g(i,N)$ defined in Equations (2) to (7).

Figure 8:
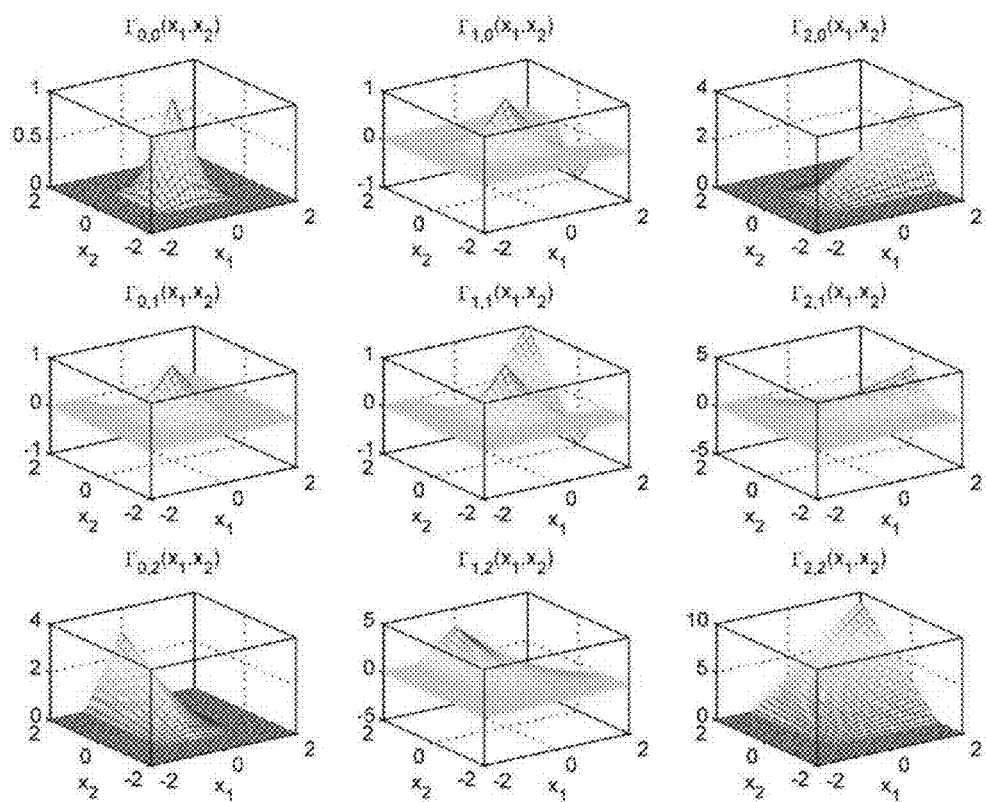
FIG. 8 shows mesh plots for a set of interpolation and extrapolation basis functions for a 2-dimensional lookup table.
Figure 9:
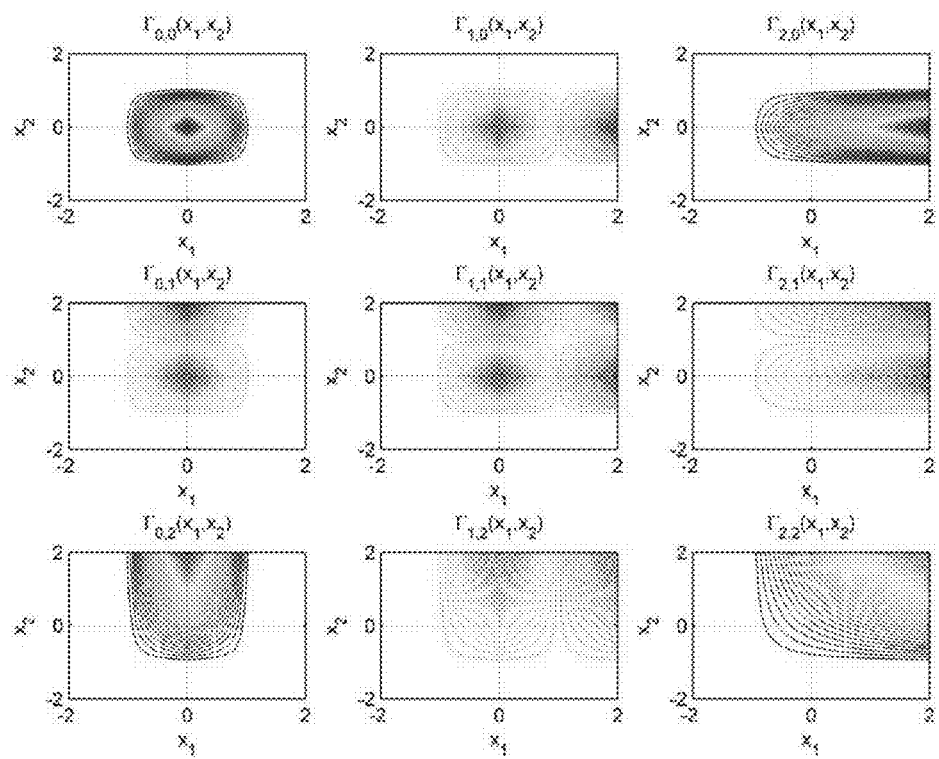
FIG. 9 shows contour plots for a set of interpolation and extrapolation basis functions for a 2-dimensional lookup table.

The 2D LUT basis functions $\Gamma_{i,j}(x_1, x_2)$ of $f_{\overline{\varphi}}(x_1, x_2)$ may therefore be derived as the product the of 1D basis functions $\Lambda_i(x)$, thus providing nine possible 2D basis functions. The 3D mesh and contour plots for basis functions $\Gamma_{i,j}(x_1, x_2)$ are depicted in FIGS. 8 and 9, respectively.

Figure 10:
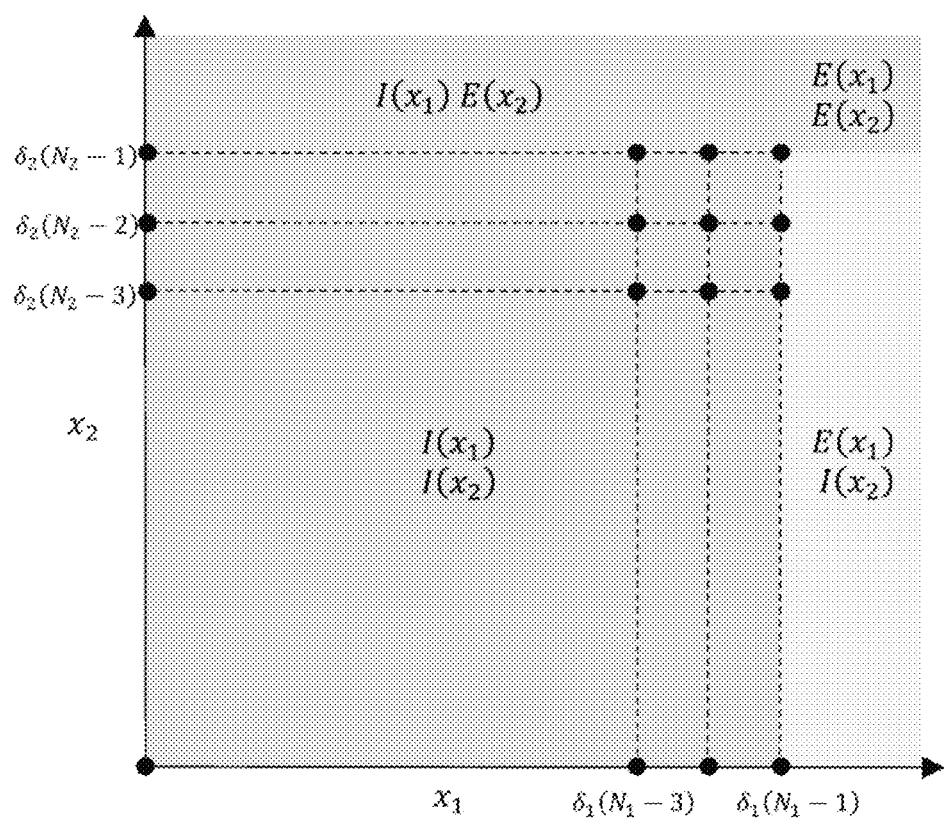
FIG. 10 shows interpolation and extrapolation regions along both dimensions of a 2-dimensional lookup table.
Figure 11:
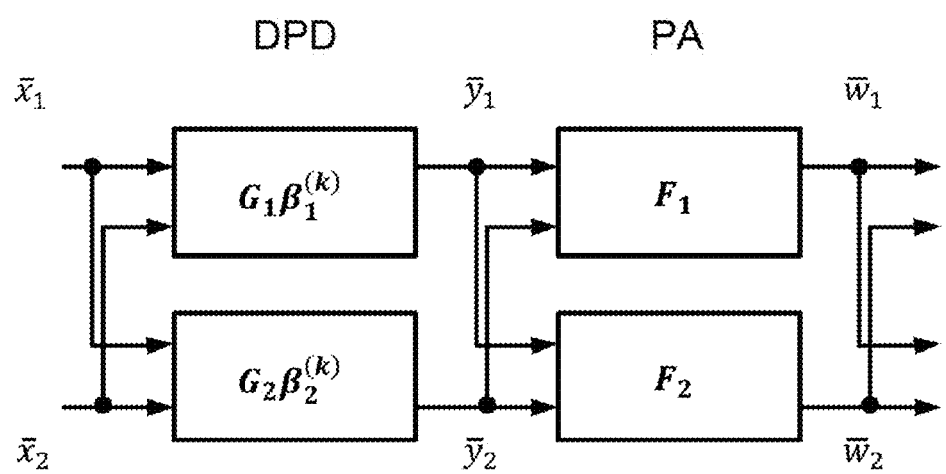
FIG. 11 shows a block diagram illustrating a coefficient adaptation scheme for a 2-dimensional lookup table dual-band DPD system.

The application of 2D LUT output $f_{\overline{\varphi}}(x_1, x_2)$ to a 2D LUT may thus produce a basis function assignment as previously introduced in FIG. 5, where the basis functions yield $f_{\overline{\varphi}}(x_1, x_2)$ as a bilinear interpolation inside of the rectangular interpolation region and a linear extrapolation in the $x_1$ and/or $x_2$ direction in the surrounding extrapolation region. As also depicted in FIG. 10, the specific interpolation and extrapolation regions may be further defined into four distinct regions as follows:

a. $0 \leq x_1 \leq \delta_1(N_1-1)$ and $0 \leq x_2 \leq \delta_2(N_2-1)$: interpolation in both the $x_1$ and $x_2$ directions
b. $0 \leq x_1 \leq \delta_1(N_1-1)$ and $x_2 \geq \delta_2(N_2-1)$: interpolation in the $x_1$ direction, extrapolation in the $x_2$ direction
c. $x_1 \geq \delta_1(N_1-1)$ and $0 \leq x_2 \leq \delta_2(N_2-1)$: extrapolation in the $x_1$ direction, interpolation in the $x_2$ direction
d. $x_1 \geq \delta_1(N_1-1)$ and $x_2 \geq \delta_2(N_2-1)$: extrapolation in both the $x_1$ and $x_2$ directions Accordingly, the interpolation and extrapolation capabilities $f_{\overline{\varphi}}(x_1, x_2)$ may dramatically extend the effective domain of DPD circuits 304a and 304b, as the contained 2D LUTs may be able to produce output $f_{\overline{\varphi}}(|x_1|, |x_2|)$ for all $x_1$ and $x_2$ via extrapolation.

Each of DPD circuits 304a and 304b may thus receive complex baseband samples $x_1$ and $x_2$ and respectively produce complex outputs $y_1$ and $y_2$ based on the interpolation and extrapolation provided by the LUT output function $f_{\overline{\varphi}}(|x_1|, |x_2|)$ for each 2D LUT. As previously indicated, DPD circuits 304a and 304b may apply the LUT output given by for each of the 2D LUTs as a complex gain to the corresponding function of input samples $x_1$ and $x_2$ and sum the resulting samples to obtain complex DPD outputs $y_1$ and $y_2$, respectively. The respective DPD outputs $y_1$ and $y_2$ for the 2D LUT model may be derived from the wideband generalized memory polynomial (GMP) DPD model with even-only polynomial powers. As detailed in D. R. Morgan, Z. Ma, J. Kim, M. G. Zierdt, and J. Pastalan, "A generalized memory polynomial model for digital predistortion of RF power amplifiers", *IEEE Trans. Signal Process.*, vol. 54, pp. 3852-3860, October 2006, the wideband GMP model operating on wideband input $x(n)$ may be expressed as $$y_{GMP}(n) = \sum_{m=0}^{M} x(n-m)\left(\sum_{k=0}^{(K-1)/2} b_{k,m}|x(n-m)|^{2k}\right) + \quad (21)$$

$$\sum_{l \neq 0}\sum_{m=0}^{M} x(n-m-l)\left(\sum_{k=1}^{(K-1)/2} b_{k,m,l}|x(n-m)|^{2k}\right)$$

Wideband input x(n) may thus be expressed as the sum of the first and second band signals baseband $x_1(n)$ and $x_2(n)$ as follows $$x(n)=x_1(n)e^{j\theta_1 n}+x_2(n)e^{j\theta_2 n} \quad (22)$$

where the baseband signals $x_1(n)$ and $x_2(n)$ are modulated by two carrier with respective frequencies $\theta_1/(2\pi T_s)$ and $\theta_2/(2\pi T_s)$ with sampling period $T_s$.

Wideband GMP output $y_{GMP}(n)$ may thus be expressed as $y_{GMP}(n)=y_{GMP,1}(n)e^{j\theta_1 n}+y_{GMP,2}(n)e^{j\theta_2 n}+w(n)$ where $y_{GMP,1}(n)$ and $y_{GMP,2}(n)$ are the components of $y_{GMP}(n)$ at carrier frequencies $\theta_1/(2\pi T_s)$ and $\theta_2/(2\pi T_s)$ and $w(n)$ gives the components of $y_{GMP}(n)$ at the other inter-modulation products of the carrier frequencies.

The final dual-band GMP model may thus be given as $$y_{GMP,1}(n) = \quad (23)$$
$$\sum_{m=0}^{M} x_1(n-m)\sum_{k=0}^{(K-1)/2} b_{k,m} e^{-j\theta_1 m} \sum_{r=0}^{k} \binom{k}{r}\binom{k+1}{r+1}|x_1(n-m)|^{2r}$$
$$|x_2(n-m)|^{2(k-r)} + \sum_{l\neq 0}\sum_{m=0}^{M}\sum_{k=0}^{(K-1)/2} b_{k,m,l}$$
$$\left( \begin{array}{l} x_1(n-m-l)\sum_{r=0}^{k}\binom{k}{r}\binom{k}{r}|x_1(n-m)|^{2r}|x_2(n-m)|^{2(k-r)}e^{-j\theta_1(m+l)} + \\ x_1(n-m)x_2^*(n-m)x_2(n-m-l)\sum_{s=0}^{k-1}\binom{k}{s}\binom{k}{s+1} \\ |x_1(n-m)|^{2s}|x_2(n-m)|^{2(k-s-1)}e^{-j\theta_2 l}e^{-j\theta_1 m} \end{array} \right)$$

$$y_{GMP,2}(n) =$$
$$\sum_{m=0}^{M} x_2(n-m)\sum_{k=0}^{(K-1)/2} b_{k,m} e^{-j\theta_2 m} \sum_{r=0}^{k} \binom{k}{r}\binom{k+1}{r+1}|x_2(n-m)|^{2r}$$
$$|x_1(n-m)|^{2(k-r)} + \sum_{l\neq 0}\sum_{m=0}^{M}\sum_{k=0}^{(K-1)/2} b_{k,m,l}$$
$$\left( \begin{array}{l} x_2(n-m-l)\sum_{r=0}^{k}\binom{k}{r}\binom{k}{r}|x_2(n-m)|^{2r}|x_1(n-m)|^{2(k-r)}e^{-j\theta_2(m+l)} + \\ x_2(n-m)x_1^*(n-m)x_1(n-m-l)\sum_{s=0}^{k-1}\binom{k}{s}\binom{k}{s+1} \\ |x_2(n-m)|^{2s}|x_1(n-m)|^{2(k-s-1)}e^{-j\theta_1 l}e^{-j\theta_2 m} \end{array} \right)$$

The dual-band GMP model of Equation (23) may be adapted to two-dimensional polynomial functions to allow odd polynomial powers and separate model parameters for each band as $$y_{GMP-2D,1}(n) = \sum_{m=0}^{M} x_1(n-m)\sum_{k=0}^{K-1}\sum_{r=0}^{k} b_{r,k,m}|x_1(n-m)|^r|x_2(n-m)|^{k-r} + \quad (24)$$
$$\sum_{l\neq 0}\sum_{m=0}^{M}\left( \begin{array}{l} x_1(n-m-l)\sum_{k=1}^{K-1}\sum_{r=0}^{k} b_{r,k,m,l,1}|x_1(n-m)|^r|x_2(n-m)|^{(k-r)} + \\ x_1(n-m)x_2^*(n-m)x_2(n-m-l) \\ \sum_{k=1}^{K-1}\sum_{r=0}^{k-2} b_{r,k,m,l,2}|x_1(n-m)|^r|x_2(n-m)|^{k-r-2} \end{array} \right)$$

$$y_{GMP-2D,2}(n) = \sum_{m=0}^{M} x_2(n-m)\sum_{k=0}^{K-1}\sum_{r=0}^{k} c_{r,k,m}|x_2(n-m)|^r|x_1(n-m)|^{k-r} +$$
$$\sum_{l\neq 0}\sum_{m=0}^{M}\left( \begin{array}{l} x_2(n-m-l)\sum_{k=1}^{K-1}\sum_{r=0}^{k} c_{r,k,m,l,1}|x_2(n-m)|^r|x_1(n-m)|^{(k-r)} + \\ x_2(n-m)x_1^*(n-m)x_1(n-m-l) \\ \sum_{k=1}^{K-1}\sum_{r=0}^{k-2} c_{r,k,m,l,2}|x_2(n-m)|^r|x_1(n-m)|^{k-r-2} \end{array} \right)$$

The final 2D LUT dual-band DPD outputs $y_1$ and $y_2$ of DPD circuits 304a and 304b may then be obtained by replacing the 2D polynomial functions of Equation (24) with the 2D LUT output function $f_{\overline{\Phi}}(|x_1(\bullet)|, |x_2(\bullet)|)$ for each of the respective 2D LUTs of DPD circuits 304a and 304b as detailed above. The full 2D LUT dual-band DPD outputs may thus be expressed as $$y_{GMLUT-2D,1}(n) = \sum_{m=0}^{M} x_1(n-m)f_{\overline{\Phi}_{1,m,0,0}}(|x_1(n-m)|, |x_2(n-m)|) + \quad (25)$$
$$\sum_{l\neq 0}\sum_{m=0}^{M}\left( \begin{array}{l} x_1(n-m-l)f_{\overline{\Phi}_{1,m,l,1}}(|x_1(n-m)|, |x_2(n-m)|) + \\ x_1(n-m)x_2^*(n-m)x_2(n-m-l) \\ f_{\overline{\Phi}_{1,m,l,2}}(|x_1(n-m)|, |x_2(n-m)|) \end{array} \right)$$

$$y_{GMLUT-2D,2}(n) = \sum_{m=0}^{M} x_2(n-m)f_{\overline{\Phi}_{2,m,0,0}}(|x_2(n-m)|, |x_1(n-m)|) +$$
$$\sum_{l\neq 0}\sum_{m=0}^{M}\left( \begin{array}{l} x_2(n-m-l)f_{\overline{\Phi}_{2,m,l,1}}(|x_1(n-m)|, |x_2(n-m)|) + \\ x_2(n-m)x_1^*(n-m)x_1(n-m-l) \\ f_{\overline{\Phi}_{2m,l,2}}(|x_1(n-m)|, |x_2(n-m)|) \end{array} \right)$$

where each LUT $f_{\overline{\Phi},2}(|x_1(\bullet)|, |x_2(\bullet)|)$ may be expressed as $$f_{\overline{\Phi}}(x_1,x_2)=\overline{\Gamma}(x_1,x_2)\hat{\Phi} \quad (26)$$

where $\overline{\Gamma}(x_1, x_2)$ is a row vector containing all the $\Gamma_{i,j}(x_1, x_2)$ 2D LUT basis functions and $\overline{\Phi}$ is a column vector containing the corresponding $\varphi_{i,j}$ coefficients.

DPD circuits 304a and 304 may thus generate DPD outputs $y_1$ and $y_2$ where each respective DPD output sample $y_{GMLUT-2D,1}(n)$ and $y_{GMLUT-2D,2}(n)$ is the product of a plurality of terms. As defined in Equation (25), each of the terms may be expressed as the product of a function of current and/or past input samples of $x_1$ and/or $x_2$ and a 2D LUT output, where each 2D LUT output is a function of the magnitude of the current and/or past input samples of $x_1$ and $x_2$. DPD outputs $y_1$ and $y_2$ may thus include the cross-terms expressed in the double-sum operators. DPD circuits 304a and 304b may be structurally embodied as either hardware or software according to the arithmetic logic associated with a particular DPD output generation scheme, such as e.g. according to the logic defined in Equation (25). Accordingly, DPD circuits 304a and 304b may thus be realized as a processor configured to execute program code corresponding to the arithmetic logic (e.g. of Equation (25), such as in a software-implemented Digital Front End (DFE) or "soft DFE"), an FPGA configured according to the arithmetic logic of Equation (25), or an ASIC configured according to the arithmetic logic of Equation (25). DPD circuits 304a and 304b may additionally include a respective memory component configured to store the respective 2D LUT coefficient vectors $\overline{\Phi}_1$ and $\overline{\Phi}_2$.

As previously indicated, DPD adaptation circuits 318a and 318b may be configured to dynamically adapt the LUT coefficients $\varphi_{i,j}$ of $\overline{\Phi}_1$ and $\overline{\Phi}_2$, respectively, based on the complex baseband PA output samples $z_1$ and $z_2$ provided by feedback process circuits 316a and 316b. DPD adaptation circuits 318a and 318b may apply either direct learning (as detailed in R. N. Braithwaite, "Wide bandwidth adaptive digital predistortion of power amplifiers using reduced order memory correction," in IEEE MTT-S Int. Microw. Symp. Dig., June 2008, pp. 1517-1520.) or indirect learning (as detailed in D. R. Morgan, Z. Ma, J. Kim, M. G. Zierdt, and J. Pastalan, "A generalized memory polynomial model for digital predistortion of RF power amplifiers", IEEE Trans. Signal Process., vol. 54, pp. 3852-3860, October 2006).

Both direct and indirect learning may utilize an identical DPD mathematical reference model, where a single-band output $y_i$ of DPD circuit 304a or 304b may be expressed as $$y_i(n)=\overline{g}_i(x_1(n),x_2(n))\overline{\beta}_i,i=\{1,2\} \tag{27}$$

where $\overline{g}_i(x_1(n), x_2(n))$ is a row vector of G basis functions and $\overline{\beta}_i$ is a column vector of G complex-valued coefficients.

The basis and coefficient vectors for the complete 2D LUT DPD model in (25) for the first band may thus be given as $$\overline{g}_1(x_1(n),x_2(n))=[g_{1,0}(x_n) \ldots g_{1,G-1}(x_n)]$$

$$g_{1,0}(x_1(n),x_2(n))=(n))=x_1(n)\overline{\Gamma}(|x_1(n)|,|x_2(n)|)$$

$$g_{1,G-1}(x_1(n),x_2(n))=x_1(n-M)x_2*(n-M)x_2(n-M-l_{end})\cdot \overline{\Gamma}(|x_1(n-M)|,|x_2(n-M)|)$$

$$\overline{\beta}_1=[\overline{\Phi}_{1,0,0,0}{}^T \ldots \Phi_{1,M,l_{end}-2}{}^T] \tag{28}$$

where the basis and coefficients vectors for the second band may be analogously derived. $\overline{\beta}_i$ may thus represent the LUT coefficient vectors $\Phi$ for the 2D LUTs of each of DPD circuits 304a and 304b.

Output vectors $\overline{y}_i=[y_i(n) \ldots y_i(n+M-1)]^T$ of M outputs $y_i(n)$ from Equation (27) can thus be represented as a function of input vectors $\overline{x}_i=[x_i(n) \ldots x_i(n+M-1)]^T$ of M inputs $x_i(n)$ as $$\overline{y}_i = \begin{bmatrix} \overline{g}_i(x_1(n), x_2(n)) \\ \vdots \\ \overline{g}_i(x_1(n+M-1), x_2(n+M-1)) \end{bmatrix} \overline{\beta}_i \tag{29}$$

$$= G_i(\overline{x}_1, \overline{x}_2)\overline{\beta}_i$$

For indirect learning, DPD adaptation circuits 318a and 318b may adapt the LUT coefficients $\overline{\beta}_1$ and $\overline{\beta}_2$, respectively, using least squares as follows:

$$\overline{\beta}_i=(G(\overline{z}_1,\overline{z}_2)^H G(\overline{z}_1,\overline{z}_2))_{-1}G(\overline{z}_1,\overline{z}_2)^H \overline{y}_i \tag{30}$$

where $\overline{z}_i(n)=[z_i(n) \ldots z_i(n+m-1)]^T$ is a vector of PA outputs $z_i$ (as provided by feedback process circuit 316) that is time-aligned to $\overline{x}_i(n)$ and scaled by the inverse of the nominal transmit gain.

DPD adaptation circuits 318a and 318b may alternatively apply direct learning to adapt $\varphi_{i,j}$ for each of the 2D LUTs. FIG. 12 depicts a block diagram illustrating the cascade of DPD circuits 304a and 304b and PA 312 where PA 312 produces $\overline{w}_i$ given an input of $\overline{y}_i$ according to transfer functions $F_1$ and $F_2$. The dual-band models for DPD circuits 304a and 304b and PA 312 may be expressed as $$\overline{w}_i=F_i(\overline{y}_1,\overline{y}_2)$$

$$\overline{y}_i=G_i(\overline{x}_1,\overline{x}_2)(\overline{\beta}_i{}^{(k)}) \tag{31}$$

DPD adaptation circuits 318a and 318b may update the LUT coefficients $\varphi_{i,j}$ for each 2D LUT by estimating $\overline{\Delta\beta}_i$, i.e. the increments to DPD coefficients $\overline{\beta}_i{}^{(k)}$ at each iteration k, so that the magnitude squared of the error of the combined signal of the output of PA 312 is minimized.

Defining $G_{PA}$ as the gain of PA 312, the error vectors at each band may be written as $$\overline{e}_i=\overline{x}_i G_{PA}-\overline{w}_i \tag{32}$$

Let $\theta_i=f_i/(2\pi T)$, where $f_i$ are the band center frequency offsets and T is the sampling period. Accordingly, if $f_2-f_1$ is sufficiently larger than the signal bandwidth, minimizing the squared error of the combined signal is equivalent to minimizing the squared error of the individual bands, i.e.

$$E\{|e^2|\} = E\{(e_1^* e^{-\theta_1 n} + e_2^* e^{-\theta_2 n})(e_1 e^{\theta_1 n} + e_2 e^{\theta_2 n})\} \tag{33}$$

$$= E\{|e_1|^2\} + E\{|e_2|^2\}$$

The $(\overline{x}_1, \overline{x}_2)$ indices may be dropped from $G_i$ and $F_i$ for clarity. The difference between the output of PA 312 from iteration k to k+1 may be expressed as $$F_i(G_1(\overline{\beta}_1{}^{(k)}+\Delta\overline{\beta}_1),G_2(\overline{\beta}_2{}^{(k)}+\Delta\overline{\beta}_2))-F_i(G_1(\overline{\beta}_1{}^{(k)}),G_2(\overline{\beta}_2{}^{(k)})) \tag{34}$$

The optimization problem may then be stated as follows:

$$\min_{\Delta\overline{\beta}_1,\Delta\overline{\beta}_2} \begin{cases} \left\| F_1(G_1(\overline{\beta}_1^{(k)} + \Delta\overline{\beta}_1), G_2(\overline{\beta}_2^{(k)} + \Delta\overline{\beta}_2)) - \right. \\ \left. F_1(G_1(\overline{\beta}_1^{(k)}), G_2(\overline{\beta}_2^{(k)})) - \overline{e}_1 \right\|^2 \\ \left\| F_2(G_2(\overline{\beta}_2^{(k)} + \Delta\overline{\beta}_2), G_1(\overline{\beta}_1^{(k)} + \Delta\overline{\beta}_1)) - \right. \\ \left. F_2(G_2(\overline{\beta}_2^{(k)}), G_1(\overline{\beta}_1^{(k)})) - \overline{e}_2 \right\|^2 \end{cases} \tag{35}$$

As detailed in Y. Ma, Y. Yamao, Y. Akaiwa and K. Ishibashi "Wideband digital predistortion using spectral extrapolation of band-limited feedback signal", IEEE Trans. Circuits Syst. I, Reg. Papers, vol. 61, no. 7, pp. 2088-2097 2014, $F_i$ may be approximated as the linear functions $F_i G_{PA} \overline{y}_i$. Such may serve as an effective approximation for the purpose of deriving an error signal that drives $\overline{\beta}_i$ in the direction of the MSSE solution as PA 314 may be dominated by the linear component. The minimization thus becomes $$\min_{\Delta\overline{\beta}_1,\Delta\overline{\beta}_2} \begin{cases} \left\| G_{PA} G_1(\overline{\beta}_1^{(k)} + \Delta\overline{\beta}_1) - G_{PA} G_1(\overline{\beta}_1^{(k)}) - \overline{e}_1 \right\|^2 + \\ \left\| G_{PA} G_2(\overline{\beta}_2^{(k)} + \Delta\overline{\beta}_2) - G_{PA} G_2(\overline{\beta}_2^{(k)}) - \overline{e}_2 \right\|^2 \end{cases} \tag{36}$$

Equation (36) may be restated as two independent minimization problems as $$\min_{\Delta\overline{\beta}_1}\{\|G_1\Delta\overline{\beta}_1 - (\overline{x}_1 - \overline{w}_1 G_{PA}^{-1})\|^2\} \tag{37}$$

$$\min_{\Delta\overline{\beta}_2}\{\|G_2\Delta\overline{\beta}_2 - (\overline{x}_2 - \overline{w}_2 G_{PA}^{-1})\|^2\}$$

Defining $\overline{z}_i=\overline{w}_i G_{PA}^{-1}$, the LS solution may be obtained by setting $G_i\Delta\overline{\beta}_i-(\overline{x}_i-\overline{z}_i)$ orthogonal to $G_i$ thus yielding $$\overline{\Delta \beta}_i = (G_i(\overline{x}_1, \overline{x}_2)^H G_i(\overline{x}_1, \overline{x}_2))^{-1} G_i(\overline{x}_1, \overline{x}_2)^H (\overline{x}_i, \overline{z}_i)$$

$$\overline{\beta}_i^{(k)} = \overline{\beta}_i^{(k)} + \mu \overline{\Delta \beta}_i \qquad (38)$$

where $0 \leq \mu \leq 1$ is a constant and sub-index k is the iteration index.

DPD adaptation circuits 318a and 318b may perform the inverse operation using the pseudo-inverse function with given tolerance in order to control the rank of the basis matrix and the number of eigenvectors used in the solution. DPD adaptation circuits 318a and 318b may additionally apply QR LS and sparse matrix techniques, which are well-established for wide-band cases and available for analogous application in the dual-band case detailed herein.

Accordingly, DPD adaptation circuits 318a and 318b may receive the time-aligned and gain-scaled PA output samples $z_i(n)$ and adapt the LUT coefficients $\overline{\beta}_1$ and $\overline{\beta}_2$ (as defined above in Equation (28)) of DPD circuits 304a and 304b, respectively. DPD circuits 304a and 304b may thus apply the updated LUT coefficients to new baseband input samples $x_1$ and $x_2$ for predistortion application to linearize the output of PA 312.

Returning to FIG. 5, DPD circuits 304a and 304b may each apply interpolation and extrapolation dependent on the location of a given input point ($x_1$, $x_2$) relative to the LUT points of the respective 2D LUT. As shown in FIG. 5, the bilinear interpolation region may be rectangular with dimensions according to $N_1$ and $N_2$ and may be surrounded by mixed interpolation and extrapolation regions and a bilinear extrapolation region as shown in FIG. 10.

As the LUT coefficients are directly estimated (by DPD adaptation circuits 318a and 318b) from input samples $x_i$, some coefficients may be based on more "observations", i.e. input signals falling within the influenced region of the coefficient, than others. As previously detailed, each LUT coefficient point ($i\delta_1$, $j\delta_2$, $\varphi_{i,j}$) may provide a contribution to $f_\Phi(x_1, x_2)$ in the four neighboring regions defined in Equations (12)-(15). Accordingly, LUT coefficient points that are repeatedly adapted as a result of input points ($x_1$, $x_2$) falling within the neighboring regions may be considered "high reliability" compared to LUT coefficient points that do not have many input points ($x_1$, $x_2$) falling within the neighboring regions. The reliability of the LUT coefficients may thus be a product of the distribution of the input points ($x_1$, $x_2$), where regions of the 2D LUT that have a high concentration of input points may produce better estimates for the LUT coefficient (high reliability) and thus provide more effective predistortion than regions of the 2D LUT have a low concentration of input points (low reliability).

Figure 12A:
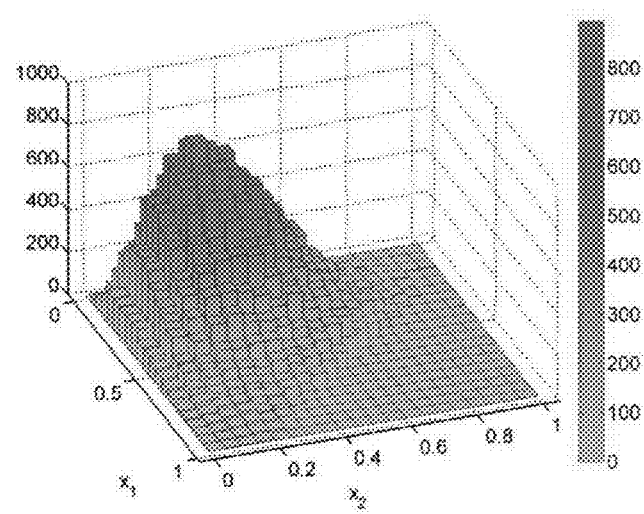
FIGS. 12A and 12B show a histogram and contour plot illustrating the distribution of dual-band input signals within the domain of a 2-dimensional lookup table.
Figure 12B:
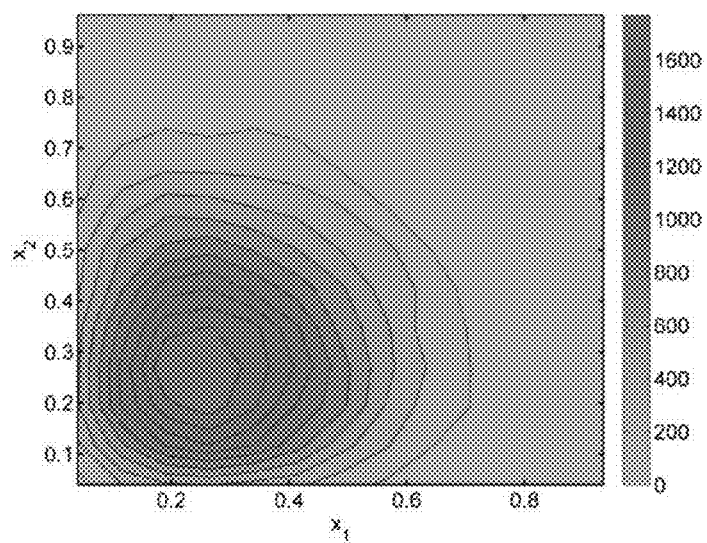

FIGS. 12A and 12B show a histogram and contour plot for a dual-band CFR output signal composed of two 20 MHz LTE signals with a carrier separation of 100 MHz. Dual-band CFR may seek to ensure a certain PAPR for the combined signal. Accordingly, even though the combined signal PAPR may be e.g. 7.1 dB in the case of FIGS. 12A and 12B, the PAPRs of the individual bands may be larger, e.g. 8.79 dB and 9.04 dB.

Given the relatively high PAPRs for the individual band signals, the distribution of input points ($x_1$, $x_2$) may be clustered towards the lower-left corner of the 2D LUT as shown in FIG. 12B. Accordingly, the probability of having peak values on both $x_1$ and $x_2$ (i.e. an input point in the upper-right corner of the 2D LUT) may be close to zero, while the probability of having lower values on both $x_1$ and $x_2$ (i.e. an input point in the lower-left corner of the 2D LUT) may be appreciably higher. Given this high expected concentration of input points in the lower-left corner, the LUT coefficients in this region may be considered of significantly higher reliability than the LUT coefficients in the upper-right corner in addition to the right extreme and upper extreme of the 2D LUT (i.e. where one of $x_1$ and $x_2$ is a peak value).

Accordingly, the 2D LUT coefficients used for extrapolation (i.e. in the outer and exterior regions of the 2D LUT) may be markedly less reliable, which may lead to adaptation stability issues if DPD system 300 exclusively utilizes the extrapolation strategy expressed in Equation (19). In order to address such issues, DPD system 300 may utilize a flexible interpolation/extrapolation (I/E) boundary as opposed to the rectangular I/E boundary shown in FIG. 5. In other words, DPD system 300 may adaptively assign individual regions as an interpolation region or extrapolation region based on the reliability of the neighboring LUT coefficients. As a result, DPD circuits 304a and 304b may apply extrapolation to certain regions using higher-reliability LUT coefficients from non-directly neighboring regions as opposed to the low reliability LUT coefficients from the directly neighboring regions. DPD circuits 304a and 304b may continue to apply interpolation in regions having LUT coefficients with sufficient reliability. DPD system 300 may accomplish this by assigning specific basis functions, i.e. either interpolation basis functions or extrapolation basis functions, to each the LUT coefficient points to assign each region for interpolation or extrapolation.

This problem may be stated as follows: given a 2D signal with a known Probability Distribution Function (PDF) and a grid of points ($i\delta_1$, $j\delta_2$), define a set of interpolation/extrapolation basis functions located at a subset of these points. Each location may be selected so that the value of the PDF is high enough to ensure the associated DPD coefficient has sufficient accuracy. Additionally, it should be possible to generate a flat horizontal surface over the entire region $x_1 \geq 0$, $x_2 \geq 0$ as a linear combination of the basis functions, thus ensuring that the 2D LUT is able to implement a constant linear gain without error (see Equation (18) for the interpolation case). At each point in the domain, $f_\Phi(x_1, x_2)$ should be a piecewise bilinear function of four basis functions only. DPD system 300 may thus be adapted accordingly to facilitate the adaptation implementation.

By selectively assigning each LUT coefficient point a basis function $\Gamma_{i,j}$, $i,j \in \{0, 1, 2\}$, DPD system 300 may individually assign each "region" of the 2D LUT as an interpolation or extrapolation region, i.e. bilinear interpolation (interpolation in both the $x_1$ and $x_2$ directions), mixed interpolation/extrapolation (extrapolation in only one of the $x_1$ or $x_2$ direction), or bilinear extrapolation (extrapolation in both the $x_1$ and $x_2$ directions). While the following description may detail implementing this selective I/E region assignment in DPD circuits 304a and 304b, DPD adaptation circuits 318a and 318b may alternatively be configured to realize this functionality without departing from the scope of the present disclosure.

Figure 13:
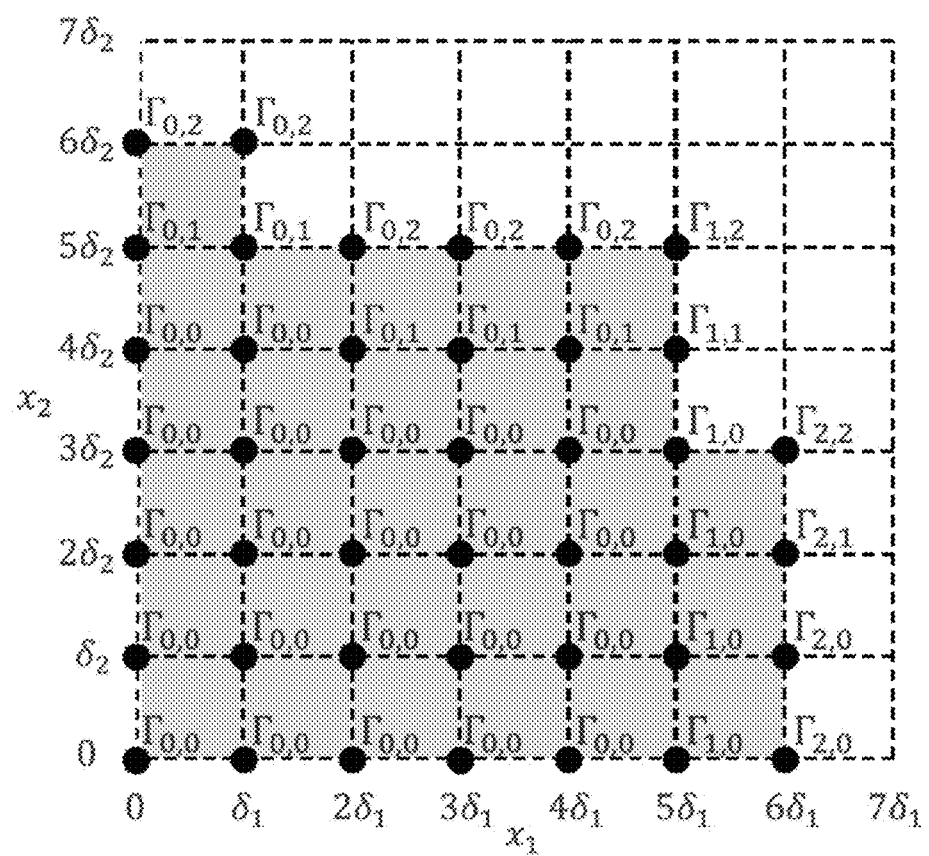
FIG. 13 shows a shows a projection of the 2-dimensional domain of a 2-dimensional lookup table with non-rectangular interpolation and extrapolation regions.

FIG. 13 shows an exemplary I/E region assignment in accordance with the following description. Each region (i.e. rectangular region bound at each of its four corners by a point on grid formed with grid spacings $\delta_1$ and $\delta_2$) of the 2D LUT may be expressed as a region $R_{ij}$ delimited by ($i\delta_1, j\delta_2$), $((i+1)\delta_1, \delta_2)$, $(i\delta_1, (j+1)\delta_2)$, and $((i+1)\delta_1, (j+1)\delta_2)$. DPD circuits 304a and 304b may mark each $R_{ij}$ region of their respective 2D LUTs as either an interpolation or extrapolation region as shown in FIG. 13, where each the four vertices of each interpolation region are included in the subset of basis functions locations (shown as block dots in FIG. 13). As DPD adaptation circuits 318a and 318b perform direct estimation of the LUT coefficients based on actual observations of input points ($x_1$, $x_2$), DPD circuits 304a and 304b may identify regions with a high concentration of observed input points (i.e. input points ($x_1$, $x_2$) that fall within the boundaries given above for a given region $R_{ij}$) as high reliability regions (higher confidence in the associated LUT coefficients), which are thus suitable for interpolation. In contrast, DPD circuits 304a and 304b may identify regions with low concentrations of observed input points as low reliability regions (lower confidence in the associated LUT coefficients), which may thus be better suited for extrapolation using higher-reliability LUT coefficients from other regions than interpolation using the lower-reliability LUT coefficients directly associated with the region. Exterior regions to the LUT, i.e. for $x_1 \geq (N_1-1)\delta_1$ and $x_2 \geq (N_2-1)\delta_2$ may remain extrapolation regions due to the finite size of the 2D LUT as bound by $N_1$ and $N_2$; accordingly, the I/E assignment may be directed towards assigning the interior regions as either interpolation or extrapolation.

DPD circuits 304a and 304b may dynamically perform this I/E region assignment based on the number of observed input points out of the total number of observed input points that fall within each region. In other words, DPD circuits 304a and 304b may assign regions with a high number (or percentage) of the total observations as interpolation regions while assigning regions with a lower number (or percentage) of the total observations as extrapolation regions, such as by comparing the number of observed input samples in each region to a normalized threshold and assigning each region to interpolation or extrapolation based on whether the number of observed input samples exceeds or falls below the threshold. DPD circuits 304a and 304b may additionally correct for "bubble" regions, i.e. where an extrapolation region is assigned between two interpolation regions in a given row or column. Such may be mathematically expressed as follows:

1) Given M input sample points ($x_1$, $x_2$), let $M_{i,j}$ be the number of samples that fall within each $R_{ij}$
2) Compare $M_{i,j}$ to normalized threshold Thr to assign interpolation regions: $R_{ij}$=I if ($M_{i,j} \geq$ Thr·M/($N_1 N_2$))
3) Remove potential "bubble" regions by adding more interpolation regions:
   a. Let r(i) be the highest value of j for which $R_{ij}$=I
   b. Let c(j) be the highest value of i for which $R_{ij}$=I
   c. For each column i ∈ {0 ... $N_1$-1}, set $R_{ij}$=I for j ∈ {0 ... r(i)}
   d. For each row j ∈ {0 ... $N_2$-1}, set $R_{ij}$=I for i ∈ {0 ... c(j)}

Accordingly, DPD circuits 304a and 304b may create a continuous interpolation region (absent of "bubble" regions) dependent on the number of input signal points observed for each region of each 2D LUT. The mechanism detailed above may ensure that the interpolation region is an orthogonal convex hull.

As there is a basis function at the corner of each interpolation region, the locations of the basis functions will be ($i\delta_1$, $j\delta_2$) where i ∈ {0 ... $i_{max}$} and j ∈ {0 ... $j_{max}$(i)} with $i_{max}$=c(0)+1, $j_{max}$(i)=r(i-1)+1 and assuming r(-1)=0. Such can be seen the placement of basis functions in FIG. 13 as represented by black dots. LUT coefficients $\varphi_{i,j}$ with $0 \leq i \leq i_{max}$ and $0 \leq j \leq j_{max}$(i) may thus be considered "active" LUT coefficients and/or as having "active" basis functions as these LUT coefficients and corresponding basis functions will contribute to $f_\varphi(x_1, x_2)$ (as one or both of interpolation or extrapolation depending on the specifically assigned basis function $\Gamma_{p(i),q(i,j)}$). Conversely, LUT coefficients $\varphi_{i,j}$ with $i > i_{max}$ and/or $j > j_{max}$(i) may be considered "inactive" LUT coefficients and/or as having "inactive" basis functions as these LUT coefficients and corresponding basis functions will not contribute to $f_\varphi(x_1, x_2)$.

This flexible extrapolation scheme can be expressed as overall LUT function $f_\Phi(x_1, x_2)$ as defined for $x_1 \geq 0$ and $x_2 \geq 0$ as $$f_\Phi(x_1, x_2) = \sum_{i=0}^{i_{max}} \sum_{j=0}^{j_{max}(i)} \varphi_{i,j} \Gamma_{p(i),q(i,j)}(x_1 - i\delta_1, x_2 - j\delta_2) \quad (39)$$

$$p(i) = \begin{cases} 0 & i < i_{max} - 1 \\ 1 & i = i_{max} - 1 \\ 2 & i = i_{max} \end{cases}$$

$$q(i,j) = \begin{cases} 0 & j < j_{max}(i) - 1 \\ 1 & j = j_{max}(i) - 1 \\ 2 & j = j_{max}(i) \end{cases}$$

The basis functions of Equation (39) are shown in the examples of FIG. 13. As illustrated in FIG. 13, the 2D basis functions are assigned as follows:

1. For any given column, the first index of $\Gamma_{x,y}$ is constant and depends on the column position: for the last two non-empty columns, the x indices are 1 and 2 and 0 for the other columns
2. For any given column, the second index of $\Gamma_{x,y}$ is 0 for all rows except for the last two rows of that column, for which the y indices are 1 and 2

The particular assignment of $\Gamma_{x,y}$ as detailed above for the outer basis functions of the interpolation region are essential in order to generate the linear gain case, in which $f_\Phi(x_1, x_2)$ produces a horizontal flat surface for $x_1 \geq 0$ and $x_2 \geq 0$ (as shown for the bilinear interpolation region in Equation (18)). Setting $\varphi_{i,j}$=1 gives as follows $$f_\Phi(x_1, x_2) = f_{left} + f_{right} \quad (40)$$

$$f_{left} = \sum_{i=0}^{i_{max}-2} \sum_{j=0}^{j_{max}(i)} \Gamma_{p(i),q(i,j)}(x_1 - i\delta_i, x_2 - j\delta_2) \quad (41)$$

$$= \sum_{i=0}^{i_{max}-2} \sum_{j=0}^{j_{max}(i)} \Gamma_{0,q(i,j)}(x_1 - i\delta_1, x_2 - j\delta_2)$$

$$= \sum_{i=0}^{i_{max}-2} \Lambda_0(x_1 - i\delta_1) \sum_{j=0}^{j_{max}(i)} \Lambda_{q(i,j)}(x_2 - j\delta_2)$$

$$= \sum_{i=0}^{i_{max}-2} \Lambda_0(x_1 - i\delta_1)$$

$$f_{right} = \sum_{i=i_{max}-1}^{i_{max}} \sum_{j=0}^{j_{max}(i)} \Gamma_{p(i),q(i,j)}(x_1 - i\delta_i, x_2 - j\delta_2) \quad (42)$$

$$= \Lambda_1(x_1 - (i_{max}-1)\delta_1) \sum_{j=0}^{j_{max}(i_{max}-1)} \Lambda_{q(i_{max}-1,j)}(x_2 - j\delta_2) +$$

$$\Lambda_2(x_1 - i_{max}\delta_1) \sum_{j=0}^{j_{max}(i_{max})} \Lambda_{q(i_{max},j)}(x_2 - j\delta_2)$$

$$= \Lambda_1(x_1 - (i_{max}-1)\delta_1) + \Lambda_2(x_1 - i_{max}\delta_1)$$

$$f_\Phi(x_1, x_2) = \sum_{i=0}^{i_{max}-2} \Lambda_0(x_1 - i\delta_1) + \Lambda_1(x_1 - (i_{max}-1)\delta_1) + \quad (43)$$

$$\Lambda_2(x_1 - i_{max}\delta_1)$$

$$= 1$$

The flexible extrapolation assignment shown above is not unique, and other basis assignment schemes may be produced to similarly satisfy the linear gain condition to generate a horizontal flat surface over $f_{\overline{\Phi}}(x_1, x_2)$. For example, the roles of i and j in Equation (39) may be swapped to produce a "transposed" interpolation region. Equation (39) additionally satisfies the criteria that any point in the domain of $f_{\overline{\Phi}}(x_1, x_2)$ is a linear combination of four basis functions only.

Accordingly, DPD system 300 may utilize the flexible extrapolation scheme detailed above to ensure that interpolation is performed with high-reliability LUT coefficients for each 2D LUT, where coefficient reliability is determined by examining the relative distribution of observed input points within the domain of the 2D LUT. DPD system 300 may assign one or more "internal" regions of each 2D LUT as extrapolation regions if DPD system 300 determines that the associated LUT coefficients of the internal regions have low reliability, i.e. have a low distribution of observed input points $(x_1, x_2)$ which may lead to inaccurate coefficient adaptation and estimation. DPD system 300 may assign these regions as extrapolation regions by assigning extrapolation basis functions as expressed above in Equation (39), thus causing $f_{\overline{\Phi}}(x_1, x_2)$ to produce an output obtained via extrapolation with LUT coefficients from other regions for the assigned extrapolation regions. As the LUT coefficients from other regions are identified as having sufficiently high reliability, the resulting outputs of $f_{\overline{\Phi}}(x_1, x_2)$ generated via extrapolation may produce more accurate LUT outputs and accordingly produce more effective predistortion for linearizing the output of PA 312.

DPD system 300 may be configured to dynamically adapt the flexible extrapolation assignment during runtime, and accordingly may re-assign a given region $R_{ij}$ as interpolation or extrapolation regions based on the comparison of $M_{ij}$ to the normalized threshold Thr. Accordingly, DPD system 300 may adapt the flexible extrapolation assignment based on the actual observed distribution of $x_1$ and $x_2$ over time.

Such may be particularly advantageous when considering the effects of gain circuits 302 and AGC circuit 320. As previously detailed regarding FIGS. 12A and 12B, DPD system 300 may assign the flexible extrapolation regions based on the distribution of $x_1$ and $x_2$, i.e. the magnitudes of the first and second bands. Accordingly, an increase in gain by AGC circuit 320 of the applied gain at gain circuits 302a and 302b may appreciably shift the distribution towards values of $x_1$ and $x_2$ with higher magnitude, i.e. away from the lower left corner towards the outer regions of the 2D LUT (depending on AGC circuit 320 increases the gain for one or more both of the first band and second), and vice versa for decreases in the gain by AGC circuit 320. As a result of an increased gain, DPD system 300 may observe a higher concentration of input points at outer regions of the 2D LUT, thus producing higher reliability LUT coefficients for such regions and allowing for DPD system 300 to accurately apply interpolation in such regions. The flexible extrapolation scheme may thus allow DPD system 300 to adjust the extrapolation regions according to input point distribution shifts caused by AGC adjustments and analogous scenarios affecting the distribution of observed input points. Alternatively, DPD system 300 may utilize static interpolation and extrapolation regions that remain constant throughout runtime and may be initiated based on known probability information for $x_1$ and $x_2$, such as e.g. a PDF for $x_1$ and $x_2$. In such a scenario, DPD system 300 may utilize static interpolation and extrapolation regions where the interpolation and extrapolation regions are assigned based on whether the multivariate PDF for $x_1$ and $x_2$ exceeds a threshold in each region, i.e. where regions where an average of the multivariate PDF exceeding the threshold are assigned as interpolation regions and regions where the average of the multivariate PDF does not exceed the threshold are assigned as extrapolation regions.

In terms of LUT initialization, DPD circuits 304a and 304b may be configured to utilize initial LUT coefficients prior to the start of runtime operations. For simplicity, DPD circuits 304a and 304b may be initialized by setting the LUT coefficients of the "main tap" (i.e. the DPD term in which the LUT multiplies the input associated with the DPD delay) for a constant gain, i.e. by assigning all LUT coefficients of the respective 2D LUT to an arbitrary constant value, e.g. 1, and the LUT coefficients of all the other LUTs to zero. Alternatively, DPD circuits 304a and 304b may be initialized to other predefined LUT coefficients, such as LUT coefficients based on a polynomial or other DPD model. DPD adaptation circuits 318a and 318b may then subsequently adapt the LUT coefficients upon start of runtime as detailed above. Alternatively, DPD adaptation circuits 318a and 318b may execute a calibration or learning stage in order to initialize the LUT coefficients of DPD circuits 304a and 304b.

The 2D LUT extrapolation scheme in addition to the flexible extrapolation scheme detailed herein may be applied to various other technologies other than DPD, in particular for computer and digital graphic applications. Furthermore, while detailed above regarding dual-band DPD the 2D LUT schemes may additionally be applicable to single-band or wideband DPD applications that utilize respective real and imaginary signal parts as two-dimensional inputs to a 2D LUT. While particularly applicable for radio transmitters such as base stations, RRHs, and point-to-point backhaul links, the 2D LUT DPD system may be readily applied for predistortion in any system to linearize the response of an electrical component.

Additionally, the 2D LUTs depicted in FIGS. 5 and 13 utilize two positive real inputs ($x_1$ and $x_2$ as the respective magnitude of complex baseband samples from the first band and second band), and accordingly result in the 2D LUT being defined in the first quadrant ($x_1 \geq 0$ and $x_2 \geq 0$) using the basis functions $\Gamma_{x,y}$ shown in FIGS. 8 and 9. The 2D LUTs detailed herein may be readily adapted to one or more of the additional three quadrants ($x_1 \geq 0$ and $x_2 \leq 0$, $x_1 \leq 0$ and $x_2 \geq 0$, $x_1 \leq 0$ and $x_2 \leq 0$), such as a four-quadrant solution defined for all $x_1$ and all $x_2$ with 25 total basis functions as opposed to the 9 total basis functions depicted in FIGS. 8 and 9. Such solutions may additionally utilize 2D LUT interpolation and extrapolation in addition to flexible extrapolation assignment in an analogous manner as detailed herein for the first quadrant.

The individual components of DPD system 300 (DPD circuits 304a and 304b, interpolation and upconversion circuits 306a and 306b, combining circuit 308, feedback chain 314, feedback process circuit 316, and DPD adaptation circuits 318a and 318b) may be realized as hardware circuits or software circuits. The detailed functionality may thus be structurally embodied as dedicated hardware, such as one or more discrete ASICs or FPGAs configured to implement the functionality of one or more of the individual components of DPD system 300. The detailed functionality may alternatively be structurally embodied as dedicated software, such as one or more processors configured to retrieve program code (defined as arithmetic, logical, control, and input/output (I/O) operations) that when executed by the one or more processors directs the processor to implement the functionality of one or more individual components of DPD system 300. Alternatively, a mixture of such dedicated hardware and software components may be utilized to realize the individual components of DPD system 300.

Although FIG. 3 depicts various counterpart components (e.g. for the first band and second band) separately, such is merely intended to illustrate the functional distinct between each bock (e.g. primary association with the first band or second band). Accordingly, such components may be structurally embodied as separate components as depicted or as a single integrated component, such as a single dual-band processing component that is able to perform the related processing for each band in parallel.

Figure 14:
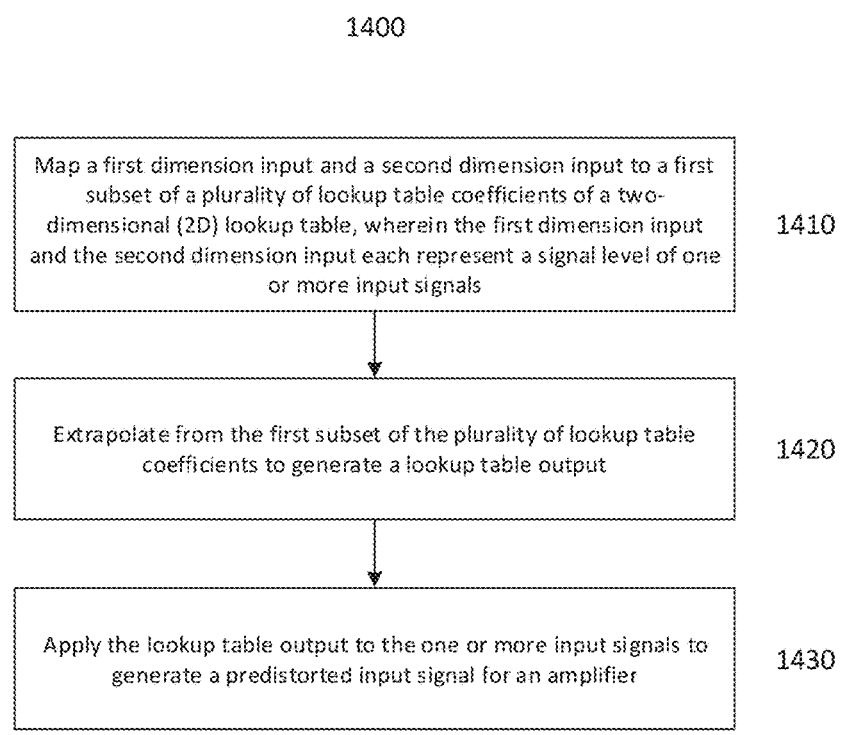
FIG. 14 shows a first method of operating an amplifier.

FIG. 14 shows method 1400 of operating an amplifier. As shown in FIG. 14, method 1400 may include mapping a first dimension input and a second dimension input to a first subset of a plurality of lookup table coefficients of a two-dimensional (2D) lookup table (1410), wherein the first dimension input and the second dimension input each represent a signal level of one or more input signals, extrapolating from the first subset of the plurality of lookup table coefficients to generate a lookup table output (1420), and applying the lookup table output to the one or more input signals to generate a predistorted input signal for an amplifier (1430).

Figure 15:
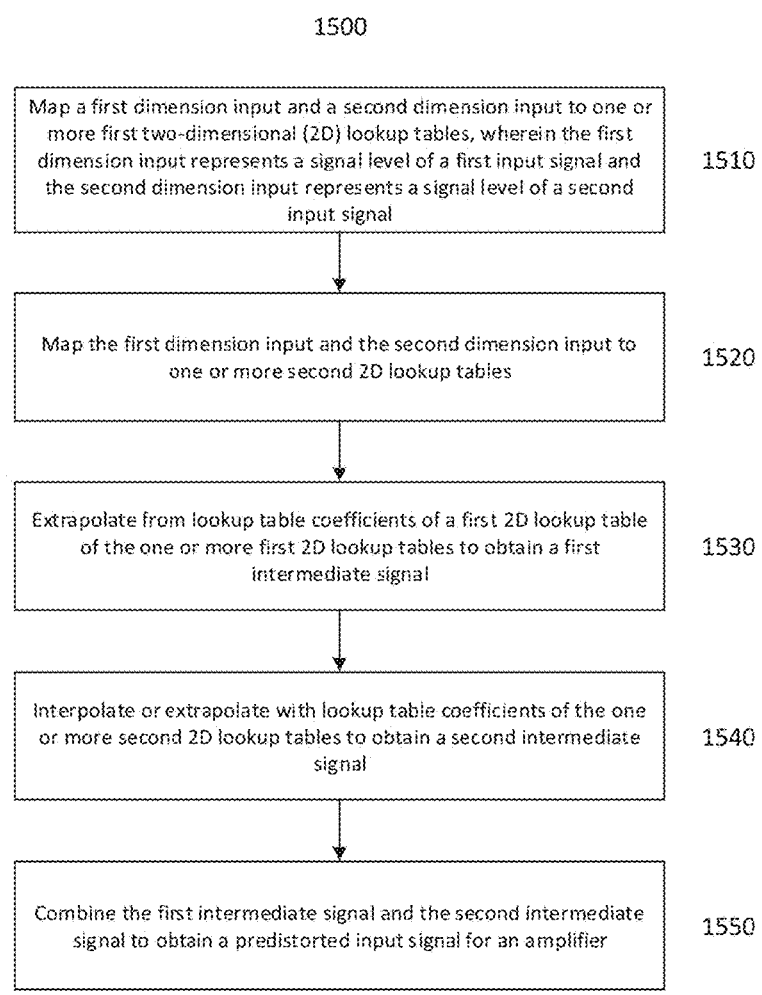
FIG. 15 shows a second method of operating an amplifier.

FIG. 15 shows method 1500 of operating an amplifier. As shown in FIG. 15, method 1500 may include mapping a first dimension input and a second dimension input to one or more first two-dimensional (2D) lookup tables (1510), wherein the first dimension input represents a signal level of a first input signal and the second dimension input represents a signal level of a second input signal, mapping the first dimension input and the second dimension input to one or more second 2D lookup tables (1520), extrapolating from lookup table coefficients of a first 2D lookup table of the one or more first 2D lookup tables to obtain a first intermediate signal (1530), interpolating or extrapolating with lookup table coefficients of the one or more second 2D lookup tables to obtain a second intermediate signal (1540), and combining the first intermediate signal and the second intermediate signal to obtain a predistorted input signal for an amplifier (1550).

In one or more further exemplary aspects of the disclosure, one or more of the features described above in reference to FIGS. 1-13 may be further incorporated into method 1400 and/or method 1500. In particular, method 1400 and/or method 1500 may be configured to perform further and/or alternate processes as detailed regarding DPD system 300, TX chain 310, or PA 312.

The terms "user equipment", "I/E", "mobile terminal", "user terminal", etc., may apply to any wireless communication device, including cellular phones, tablets, laptops, personal computers, wearables, multimedia playback devices, consumer/home appliances, vehicles, etc., and any number of additional electronic devices capable of wireless communications.

While the above descriptions and connected figures may depict electronic device components as separate elements, skilled persons will appreciate the various possibilities to combine or integrate discrete elements into a single element. Such may include combining two or more circuits for form a single circuit, mounting two or more circuits onto a common chip or chassis to form an integrated element, executing discrete software components on a common processor core, etc. Conversely, skilled persons will recognize the possibility to separate a single element into two or more discrete elements, such as splitting a single circuit into two or more separate circuits, separating a chip or chassis into discrete elements originally provided thereon, separating a software component into two or more sections and executing each on a separate processor core, etc. Given the well-established parallels between hardware logic and software logic, skilled persons will recognize the ability to realize the logic-implementing components detailed herein as either hardware logic as software logic. Furthermore, skilled persons will recognize the possibility to translate hardware logic into functionally equivalent logic embodied as program code for execution on a processor and conversely translate software logic into functionally equivalent digital hardware logic embodied as a digital logic circuit.

It is appreciated that implementations of methods detailed herein are demonstrative in nature, and are thus understood as capable of being implemented in a corresponding device. Likewise, it is appreciated that implementations of devices detailed herein are understood as capable of being implemented as a corresponding method. It is thus understood that a device corresponding to a method detailed herein may include a one or more components configured to perform each aspect of the related method.

The following examples pertain to further aspects of the disclosure:

Example 1 is a method of preprocessing amplifier input signals, the method including mapping a first dimension input and a second dimension input to a first subset of a plurality of lookup table coefficients of a two-dimensional (2D) lookup table, wherein the first dimension input and the second dimension input each represent a signal level of one or more input signals, extrapolating from the first subset of the plurality of lookup table coefficients to generate a lookup table output, and applying the lookup table output to the one or more input signals to generate a predistorted input signal for an amplifier.

In Example 2, the subject matter of Example 1 can optionally include wherein the first dimension input represents a real part of a first complex sample of a first input signal of the one or more input signals and the second dimension input represents an imaginary part of the first complex sample of the first input signal.

In Example 3, the subject matter of Example 1 can optionally include wherein the first dimension input represents a signal level of a first input signal of the one or more input signals and the second dimension input represents a signal level of a second input signal of the one or more input signals.

In Example 4, the subject matter of any one of Examples 1 to 3 can optionally include wherein applying the lookup table output to the one or more input signals to generate the predistorted input signal for the amplifier includes identifying one or more input samples of the one or more input signals, evaluating a function of the one or more input samples to obtain a function output, and generating the predistorted input signal as the product of the function output and the lookup table output.

In Example 5, the subject matter of any one of Examples 1 to 3 can optionally further include generating one or more additional lookup table outputs from one or more additional 2D lookup tables.

In Example 6, the subject matter of Example 5 can optionally include wherein applying the lookup table output to the one or more input signals to generate the predistorted input signal for the amplifier includes identifying one or more input samples of the one or more input signals, evaluating one or more functions of the one or more input samples to obtain one or more function outputs, and determining one or more intermediate products by multiplying each of the one or more function outputs by a respective lookup table output of the one or more additional lookup table outputs, and generating the predistorted input signal for the amplifier as a sum of the one or more intermediate products.

In Example 7, the subject matter of Example 6 can optionally include wherein the first dimension input and the second dimension input correspond to a current input sample of the one or more input signals, and wherein at least one of the one or more input samples is a past input sample of the one or more input signals.

In Example 8, the subject matter of Example 6 can optionally include wherein the first dimension input and the second dimension input correspond to a current input sample of the one or more input signals, and wherein each of the one or more input samples occur at the same point in time as the current input sample.

In Example 9, the subject matter of any one of Examples 6 to 8 can optionally include wherein each of the one or more input samples are samples of a first input signal of the one or more input signals.

In Example 10, the subject matter of any one of Examples 6 to 8 can optionally include wherein the one or more input samples include input samples of a first input signal and a second input signal of the one or more input signals.

In Example 11, the subject matter of Example 10 can optionally include wherein the amplifier is a dual-band amplifier, and wherein the first input signal corresponds to a first band of the dual-band amplifier and the second input signal corresponds to a second band of the dual-band amplifier.

In Example 12, the subject matter of Example 1 can optionally further include calculating a magnitude of a sample of a first input signal of the one or more input signals to obtain the first dimension input, and calculating a magnitude of a sample of a second input signal of the one or more input signals to obtain the second dimension input.

In Example 13, the subject matter of Example 1 can optionally further include calculating a squared magnitude of a first input signal of the one or more input signals to obtain the first dimension input, and calculating a squared magnitude of a second input signal of the one or more input signals to obtain the second dimension input.

In Example 14, the subject matter of any one of Examples 1 to 13 can optionally further include amplifying the predistorted input signal with the amplifier.

In Example 15, the subject matter of any one of Examples 1 to 14 can optionally further include modulating the predistorted input signal with a radio frequency signal to obtain a modulated predistorted input signal, and amplifying the modulated predistorted input signal with the amplifier.

In Example 16, the subject matter of any one of Examples 1 to 15 can optionally further include mapping an additional first dimension input and an additional second dimension input to a second subset of the plurality of lookup table coefficients of the 2D lookup table, interpolating from the second subset of the plurality of lookup table coefficients to generate an additional lookup table output, and applying the additional lookup table output to the one or more input signals to generate an additional predistorted input signal for the amplifier.

In Example 17, the subject matter of any one of Examples 1 to 15 can optionally further include mapping the first dimension input and the second dimension input to one or more additional 2D lookup tables, interpolating or extrapolating with the one or more additional 2D lookup tables to generate one or more additional lookup table outputs, wherein applying the lookup table output to the one or more input signals to generate the predistorted input signal for the amplifier includes combining the lookup table output and the one or more additional lookup table outputs to generate the predistorted input signal.

In Example 18, the subject matter of Example 17 can optionally include wherein combining the lookup table output and the one or more additional lookup table outputs to generate the predistorted input signal includes identifying one or more samples of the one or more input signals, evaluating one or more functions of the one or more samples to obtain one or more function outputs, determining one or more intermediate products by multiplying each of the one or more function outputs by one of the lookup table output or a respective lookup table output of the one or more lookup table outputs, and generating the predistorted input signal by summing the one or more intermediate products.

In Example 19, the subject matter of any one of Examples 1 to 18 can optionally further include monitoring an output signal of the amplifier, and adapting the plurality of lookup table coefficients based on the output signal of the amplifier.

In Example 20, the subject matter of any one of Examples 1 to 19 can optionally further include assigning each of a plurality of predefined regions of the 2D lookup table as an interpolation region or an extrapolation region, and reassigning at least one of the plurality of predefined regions of the 2D lookup table.

In Example 21, the subject matter of Example 20 can optionally include wherein a point formed by the first dimension input and the second dimension input falls within an extrapolation region.

In Example 22, the subject matter of Example 20 or 21 can optionally include wherein reassigning the at least one of the plurality of predefined regions of the 2D lookup table includes monitoring a plurality of pairs of first dimension inputs and second dimension inputs received for the 2D lookup table, and reassigning a first region of the plurality of predefined regions as an interpolation region if more than a predefined quantity of the plurality of pairs fall within the first region and reassigning the first region as an extrapolation region if less than the predefined quantity of the plurality of pairs fall within the first region.

Example 23 is a digital predistortion circuit configured to perform the method of any one of Examples 1 to 22.

Example 24 is a non-transitory computer readable medium storing instructions that when executed by a processor direct the processor to perform the method of any one of Examples 1 to 22.

Example 25 is a method of preprocessing amplifier input signals, the method including mapping a first dimension input and a second dimension input to one or more first two-dimensional (2D) lookup tables, wherein the first dimension input represents a signal level of a first input signal and the second dimension input represents a signal level of a second input signal, mapping the first dimension input and the second dimension input to one or more second 2D lookup tables, extrapolating from lookup table coefficients of a first 2D lookup table of the one or more first 2D lookup tables to obtain a first intermediate signal, interpolating or extrapolating with lookup table coefficients of the one or more second 2D lookup tables to obtain a second intermediate signal, and combining the first intermediate signal and the second intermediate signal to obtain a predistorted input signal for an amplifier.

In Example 26, the subject matter of Example 25 can optionally include wherein interpolating or extrapolating with lookup table coefficients of the one or more second 2D lookup tables to obtain a second intermediate signal includes interpolating with a first set of lookup table coefficients of a first 2D lookup table of the one or more second 2D lookup tables to obtain a first lookup table output, extrapolating with a second set of lookup table coefficients of a second 2D lookup table of the one or more second 2D lookup tables to obtain a second lookup table output, and combining the first lookup table output and the second lookup table output to obtain the second intermediate signal.

In Example 27, the subject matter of Example 25 or 26 can optionally include wherein extrapolating from the lookup table coefficients of the first 2D lookup table of the one or more first 2D lookup tables to obtain the first intermediate signal includes selecting a first set of lookup table coefficients from the at least one of the one or more first 2D lookup tables according to the first dimension input and the second dimension input, and extrapolating from the first set of lookup table coefficients.

In Example 28, the subject matter of any one of Examples 25 to 27 can optionally further include mapping an additional first dimension input and an additional second dimension input to the at least one of the one or more first 2D lookup tables, and interpolating between lookup table coefficients of the at least one of the one or more first 2D lookup tables to obtain an additional first intermediate signal.

In Example 29, the subject matter of any one of Examples 25 to 28 can optionally include wherein extrapolating from the lookup table coefficients of the at least one of the one or more first 2D lookup tables to obtain the first intermediate signal includes extrapolating from the lookup table coefficients of the first 2D lookup table of the one or more first 2D lookup tables to obtain a first lookup table output, interpolating between lookup table coefficients of a second 2D lookup table of the one or more first 2D lookup tables to obtain a second lookup table output, and combining the first lookup table output and the second lookup table output to obtain the first intermediate signal.

In Example 30, the subject matter of any one of Examples 25 to 29 can optionally include wherein interpolating or extrapolating with the lookup table coefficients of the one or more second 2D lookup tables to obtain the second intermediate signal includes selecting a first set of lookup table coefficients from a first 2D lookup table of the one or more second 2D lookup tables according to the first dimension input and the second dimension input, and interpolating between the first set of lookup table coefficients.

In Example 31, the subject matter of any one of Examples 25 to 29 can optionally include wherein interpolating or extrapolating with the lookup table coefficients of the one or more second 2D lookup tables to obtain the second intermediate signal includes selecting a second set of lookup table coefficients from a first 2D lookup table of the one or more second 2D lookup tables according to the first dimension input and the second dimension input, and extrapolating from the second set of lookup table coefficients.

In Example 32, the subject matter of any one of Examples 25 to 31 can optionally include wherein the first dimension input is a magnitude of a complex sample of the first input signal and the second dimension input is a magnitude of a complex sample of the second input signal.

In Example 33, the subject matter of any one of Examples 25 to 32 can optionally further include calculating a magnitude of a complex sample of the first input signal to obtain the first dimension input and calculating a magnitude of a complex sample of the second input signal to obtain the second dimension input.

In Example 34, the subject matter of any one of Examples 25 to 31 can optionally further include calculating a squared magnitude of a complex sample of the first input signal to obtain the first dimension input and calculating a squared magnitude of a complex sample of the second input signal to obtain the second dimension input.

In Example 35, the subject matter of Example 25 can optionally include wherein extrapolating from the lookup table coefficients of the first 2D lookup table of the one or more first 2D lookup tables to obtain the first intermediate signal includes extrapolating from lookup table coefficients of the first 2D lookup table of the one or more first 2D lookup tables, and interpolating or extrapolating with lookup table coefficients of one or more additional 2D lookup tables of the one or more first 2D lookup tables.

In Example 36, the subject matter of Example 25 can optionally include wherein extrapolating from the lookup table coefficients of the first 2D lookup table of the one or more first 2D lookup tables to obtain the first intermediate signal includes generating a lookup table output from each of the one or more first 2D lookup tables to obtain one or more lookup table outputs, identifying one or more samples of the first input signal and the second input signal, evaluating one or more functions of the one or more samples to obtain one or more function outputs, determining one or more intermediate products by multiplying each of the one or more function outputs by a respective lookup table output of the one or more lookup table outputs, generating the first intermediate signal as a sum of the one or more intermediate products.

In Example 37, the subject matter of Example 25 can optionally include wherein interpolating or extrapolating with the lookup table coefficients of the one or more second 2D lookup tables to obtain the second intermediate signal includes generating a lookup table output from each of the one or more second 2D lookup tables to obtain one or more lookup table outputs, identifying one or more samples of the first input signal and the second input signal, evaluating one or more functions of the one or more samples to obtain one or more function outputs, determining one or more intermediate products by multiplying each of the one or more function outputs by a respective lookup table output of the one or more lookup table outputs, generating the second intermediate signal as a sum of the one or more intermediate products.

In Example 38, the subject matter of any one of Examples 25 to 37 can optionally include wherein combining the first intermediate signal and the second intermediate signal to obtain a predistorted input signal for the amplifier includes upsampling and upconverting the first intermediate signal and the second intermediate signal, and summing the first intermediate signal and the second intermediate signal to obtain the predistorted input signal.

In Example 39, the subject matter of Example 38 can optionally further include amplifying the predistorted input signal with the amplifier.

In Example 40, the subject matter of any one of Examples 25 to 38 can optionally further include modulating the predistorted input signal with a radio carrier signal to obtain a modulated predistorted input signal, and amplifying the modulated predistorted input signal with the amplifier.

In Example 41, the subject matter of any one of Examples 25 to 40 can optionally include wherein the amplifier is a dual-band radio amplifier and the first input signal corresponds to a first band of the amplifier and the second input signal corresponds to a second band of the amplifier.

In Example 42, the subject matter of any one of Examples 25 to 41 can optionally further include monitoring an output signal of the amplifier, and adapting one or more lookup table coefficients of the one or more first 2D lookup tables or the one or more second 2D lookup tables based on the output signal of the amplifier.

In Example 43, the subject matter of any one of Examples 25 to 42 can optionally further include assigning each of a plurality of regions of a first 2D lookup table of the one or more first 2D lookup tables as an interpolation region or an extrapolation region, and reassigning at least one of the plurality of predefined regions of the first 2D lookup table.

In Example 44, the subject matter of Example 43 can optionally include wherein reassigning at least one of the plurality of predefined regions of the first 2D lookup table includes monitoring a plurality of pairs of first dimension inputs and second dimension inputs for the first 2D lookup table, and reassigning a first region of the plurality of predefined regions of the first 2D lookup table as an interpolation region if more than a predefined quantity of the plurality of pairs fall within the first region and reassigning the first region as an extrapolation region if less than the predefined quantity of the plurality of pairs fall within the first region.

Example 45 is a digital predistortion circuit configured to perform the method of any one of Examples 25 to 44.

Example 46 is a non-transitory computer readable medium storing instructions that when executed by a processor direct the processor to perform the method of any one of Examples 25 to 44.

Example 47 is a signal processing circuit arrangement including a preamplifier circuit configured to map a first dimension input and a second dimension input to a first subset of a plurality of lookup table coefficients of a two-dimensional (2D) lookup table, wherein the first dimension input and the second dimension input each represent a signal level of one or more input signals, extrapolate from the first subset of the plurality of lookup table coefficients to generate a lookup table output, and apply the lookup table output to the one or more input signals to generate a predistorted input signal for an amplifier.

In Example 48, the subject matter of Example 47 can optionally further include the amplifier.

In Example 49, the subject matter of Example 48 can optionally further include a mixing circuit configured to modulate the predistorted input signal with a radio frequency signal to obtain a modulated predistorted input signal, wherein the amplifier configured is configured to amplify the predistorted input signal.

In Example 50, the subject matter of any one of Examples 47 to 49 can optionally include wherein the first dimension input represents a real part of a first complex sample of a first input signal of the one or more input signals and the second dimension input represents an imaginary part of the first complex sample of the first input signal.

In Example 51, the subject matter of any one of Examples 47 to 49 can optionally include wherein the first dimension input represents a signal level of a first input signal of the one or more input signals and the second dimension input represents a signal level of a second input signal of the one or more input signals.

In Example 52, the subject matter of any one of Examples 47 to 51 can optionally include wherein the preamplifier circuit is configured to apply the lookup table output to the one or more input signals to generate the predistorted input signal for the amplifier by identifying one or more input samples of the one or more input signals, evaluating a function of the one or more input samples to obtain a function output, and generating the predistorted input signal as the product of the function output and the lookup table output.

In Example 53, the subject matter of any one of Examples 47 to 51 can optionally include wherein the preamplifier circuit is further configured to generate one or more additional lookup table outputs from one or more additional 2D lookup tables.

In Example 54, the subject matter of Example 53 can optionally include wherein the preamplifier circuit is configured to apply the lookup table output to the one or more input signals to generate the predistorted input signal for the amplifier by identifying one or more input samples of the one or more input signals, evaluating one or more functions of the one or more input samples to obtain one or more function outputs, and determining one or more intermediate products by multiplying each of the one or more function outputs by a respective lookup table output of the one or more additional lookup table outputs, and generating the predistorted input signal for the amplifier as a sum of the one or more intermediate products.

In Example 55, the subject matter of Example 54 can optionally include wherein the first dimension input and the second dimension input correspond to a current input sample of the one or more input signals, and wherein at least one of the one or more input samples is a past input sample of the one or more input signals.

In Example 56, the subject matter of Example 54 can optionally include wherein the first dimension input and the second dimension input correspond to a current input sample of the one or more input signals, and wherein each of the one or more input samples occur at the same point in time as the current input sample.

In Example 57, the subject matter of any one of Examples 54 to 56 can optionally include wherein each of the one or more input samples are samples of a first input signal of the one or more input signals.

In Example 58, the subject matter of any one of Examples 54 to 56 can optionally include wherein the one or more input samples include input samples of a first input signal of the one or more input signals and a second input signal of the one or more input signals.

In Example 59, the subject matter of Example 58 can optionally include wherein the amplifier is a dual-band amplifier, and wherein the first input signal corresponds to a first band of the dual-band amplifier and the second input signal corresponds to a second band of the dual-band amplifier.

In Example 60, the subject matter of any one of Examples 47 to 49 can optionally include wherein the preamplifier circuit is further configured to calculate a magnitude of a sample of a first input signal of the one or more input signals to obtain the first dimension input, and calculate a magnitude of a sample of a second input signal of the one or more input signals to obtain the second dimension input.

In Example 61, the subject matter of any one of Examples 47 to 49 can optionally include wherein the preamplifier circuit is further configured to calculate a squared magnitude of a sample of a first input signal of the one or more input signals to obtain the first dimension input, and calculate a squared magnitude of a sample of a second input signal of the one or more input signals to obtain the second dimension input.

In Example 62, the subject matter of any one of Examples 47 to 61 can optionally include wherein the preamplifier circuit is further configured to map an additional first dimension input and an additional second dimension input to a second subset of the plurality of lookup table coefficients of the 2D lookup table, interpolate from the second subset of the plurality of lookup table coefficients to generate an additional lookup table output, and apply the additional lookup table output to the one or more input signals to generate an additional predistorted input signal for the amplifier.

In Example 63, the subject matter of any one of Examples 47 to 62 can optionally include wherein the preamplifier circuit is further configured to map the first dimension input and the second dimension input to one or more additional 2D lookup tables, interpolate or extrapolate with the one or more additional 2D lookup tables to generate one or more additional lookup table outputs, wherein the preamplifier circuit is configured to apply the lookup table output to the one or more input signals to generate the predistorted input signal for the amplifier by combining the lookup table output and the one or more additional lookup table outputs to generate the predistorted input signal.

In Example 64, the subject matter of Example 63 can optionally include wherein the preamplifier circuit is configured to combine the lookup table output and the one or more additional lookup table outputs to generate the predistorted input signal by identifying one or more samples of the one or more input signals, evaluating one or more functions of the one or more samples to obtain one or more function outputs, determining one or more intermediate products by multiplying each of the one or more function outputs by one of the lookup table output or a respective lookup table output of the one or more lookup table outputs, and generating the predistorted input signal by summing the one or more intermediate products.

In Example 65, the subject matter of any one of Examples 47 to 64 can optionally further include a feedback circuit configured to monitor an output signal of the amplifier, and an adaptation circuit configured to adapt the plurality of lookup table coefficients based on the output signal of the amplifier.

In Example 66, the subject matter of Example 65 can optionally include wherein the preamplifier circuit is further configured to assign each of a plurality of predefined regions of the 2D lookup table as an interpolation region or an extrapolation region, and reassign at least one of the plurality of predefined regions of the 2D lookup table.

In Example 67, the subject matter of Example 66 can optionally include wherein a point formed by the first dimension input and the second dimension input falls within an extrapolation region.

In Example 68, the subject matter of Example 66 or 67 can optionally include wherein the preamplifier circuit is configured to reassign the at least one of the plurality of predefined regions of the 2D lookup table by monitoring a plurality of pairs of first dimension inputs and second dimension inputs received for the 2D lookup table, and reassigning a first region of the plurality of predefined regions as an interpolation region if more than a predefined quantity of the plurality of pairs fall within the first region and reassigning the first region as an extrapolation region if less than the predefined quantity of the plurality of pairs fall within the first region.

Example 69 is a radio communication device including the signal processing circuit arrangement of any one of Examples 47 to 68.

Example 70 is a signal processing circuit arrangement including a first DPD circuit configured to map a first dimension input and a second dimension input to one or more first two-dimensional (2D) lookup tables, wherein the first dimension input represents a signal level of a first input signal and the second dimension input represents a signal level of a second input signal, and to extrapolate from lookup table coefficients of a first 2D lookup table of the one or more first 2D lookup tables to obtain a first intermediate signal, a second DPD circuit configured to map the first dimension input and the second dimension input to one or more second 2D lookup tables, and to interpolate or extrapolate with lookup table coefficients of the one or more second 2D lookup tables to obtain a second intermediate signal, and a combination circuit configured to combine the first intermediate signal and the second intermediate signal to obtain a predistorted input signal for an amplifier.

In Example 71, the subject matter of Example 70 can optionally further include the amplifier.

In Example 72, the subject matter of Example 71 can optionally further include a mixing circuit configured to modulate the predistorted input signal with a radio frequency signal to obtain a modulated predistorted input signal, wherein the amplifier is configured to amplify the modulated predistorted input signal.

In Example 73, the subject matter of any one of Examples 70 to 72 can optionally include wherein the combination circuit is configured to combine the first intermediate signal and the second intermediate signal to obtain the predistorted input signal by upsampling and upconverting the first intermediate signal and the second intermediate signal, and summing the first intermediate signal and the second intermediate signal to obtain the predistorted input signal.

In Example 74, the subject matter of any one of Examples 70 to 73 can optionally include wherein the second DPD circuit is configured to interpolate or extrapolate with the lookup table coefficients of the one or more second 2D lookup tables to obtain the second intermediate signal by interpolating with a first set of lookup table coefficients of a first 2D lookup table of the one or more second 2D lookup tables to obtain a first lookup table output, extrapolating with a second set of lookup table coefficients of a second 2D lookup table of the one or more second 2D lookup tables to obtain a second lookup table output, and combining the first lookup table output and the second lookup table output to obtain the second intermediate signal.

In Example 75, the subject matter of any one of Examples 70 to 74 can optionally include wherein the first DPD circuit is configured to extrapolate from the lookup table coefficients of the first 2D lookup table of the one or more first 2D lookup tables to obtain the first intermediate signal by selecting a first set of lookup table coefficients from the first 2D lookup table of the one or more first 2D lookup tables according to the first dimension input and the second dimension input, and extrapolating from the first set of lookup table coefficients.

In Example 76, the subject matter of any one of Examples 70 to 75, wherein the first DPD circuit is further configured to map an additional first dimension input and an additional second dimension input to the first 2D lookup table of the one or more first 2D lookup tables, and interpolate between lookup table coefficients of the first 2D lookup table of the one or more first 2D lookup tables to obtain an additional first intermediate signal.

In Example 77, the subject matter of any one of Examples 70 to 76 can optionally include wherein the first DPD circuit is configured to extrapolate from the lookup table coefficients of the first 2D lookup table of the one or more first 2D lookup tables to obtain the first intermediate signal by extrapolating from the lookup table coefficients of the first 2D lookup table of the one or more first 2D lookup table to obtain a first lookup table output, interpolating between lookup table coefficients of a second 2D lookup output of the one or more first 2D lookup tables to obtain a second lookup table output, and combining the first lookup table output and the second lookup table output to obtain the first intermediate signal.

In Example 78, the subject matter of any one of Examples 70 to 77 can optionally include wherein the second DPD circuit is configured to interpolate or extrapolate with the lookup table coefficients of the one or more second 2D lookup tables to obtain the second intermediate signal by selecting a first set of lookup table coefficients from a first 2D lookup table of the one or more second 2D lookup tables according to the first dimension input and the second dimension input, and interpolating between the first set of lookup table coefficients.

In Example 79, the subject matter of any one of Examples 70 to 77 can optionally include wherein the second DPD circuit is configured to interpolate or extrapolate with the lookup table coefficients of the one or more second 2D lookup tables to obtain the second intermediate signal by selecting a second set of lookup table coefficients from a first 2D lookup table of the one or more second 2D lookup tables according to the first dimension input and the second dimension input, and extrapolating from the second set of lookup table coefficients.

In Example 80, the subject matter of any one of Examples 70 to 79 can optionally include wherein the first dimension input is a magnitude of a complex sample of the first input signal and the second dimension input is a magnitude of a complex sample of the second input signal.

In Example 81, the subject matter of any one of Examples 70 to 79 can optionally include wherein the first dimension input is a squared magnitude of a complex sample of the first input signal and the second dimension input is a squared magnitude of a complex sample of the second input signal.

In Example 82, the subject matter of Example 70 or 71 can optionally include wherein the first DPD circuit is configured to extrapolate from the lookup table coefficients of the first 2D lookup table of the one or more first 2D lookup tables to obtain the first intermediate signal by extrapolating from lookup table coefficients of the first 2D lookup table of the one or more first 2D lookup tables, and interpolating or extrapolating with lookup table coefficients of one or more additional 2D lookup tables of the one or more first 2D lookup tables.

In Example 83, the subject matter of Example 70 or 71 can optionally include wherein the first DPD circuit is configured to extrapolate from the lookup table coefficients of the first 2D lookup table of the one or more first 2D lookup tables to obtain the first intermediate signal by generating a lookup table output from each of the one or more first 2D lookup tables to obtain one or more lookup table outputs, identifying one or more samples of the first input signal and the second input signal, evaluating one or more functions of the one or more samples to obtain one or more function outputs, determining one or more intermediate products by multiplying each of the one or more function outputs by a respective lookup table output of the one or more lookup table outputs, generating the first intermediate signal as a sum of the one or more intermediate products.

In Example 84, the subject matter of Example 70 or 71 can optionally include wherein the second DPD circuit is configured to interpolate or extrapolate with the lookup table coefficients of the one or more second 2D lookup tables to obtain the second intermediate signal by generating a lookup table output from each of the one or more second 2D lookup tables to obtain one or more lookup table outputs, identifying one or more samples of the first input signal and the second input signal, evaluating one or more functions of the one or more samples to obtain one or more function outputs, determining one or more intermediate products by multiplying each of the one or more function outputs by a respective lookup table output of the one or more lookup table outputs, generating the second intermediate signal as a sum of the one or more intermediate products.

In Example 85, the subject matter of any one of Examples 70 to 84 can optionally include wherein the amplifier is a dual-band radio amplifier and the first input signal corresponds to a first band of the amplifier and the second input signal corresponds to a second band of the amplifier.

In Example 86, the subject matter of any one of Examples 70 to 85 can optionally further include a feedback circuit configured to monitor an output signal of the amplifier, and an adaptation circuit configured to adapt one or more lookup table coefficients of the one or more first 2D lookup tables or the one or more second 2D lookup tables based on the output signal of the amplifier.

In Example 87, the subject matter of any one of Examples 70 to 86 can optionally include wherein the first DPD circuit is further configured to assign each of a plurality of regions of a first 2D lookup table of the one or more first 2D lookup tables as an interpolation region or an extrapolation region, and reassigning at least one of the plurality of predefined regions of the first 2D lookup table.

In Example 88, the subject matter of Example 87 can optionally include wherein the first DPD circuit is configured to reassign the at least one of the plurality of predefined regions of the first 2D lookup table by monitoring a plurality of pairs of first dimension inputs and second dimension inputs for the first 2D lookup table, and reassigning a first region of the plurality of predefined regions of the first 2D lookup table as an interpolation region if more than a predefined quantity of the plurality of pairs fall within the first region and reassigning the first region as an extrapolation region if less than the predefined quantity of the plurality of pairs fall within the first region.

Example 89 is a radio communication device including the signal processing circuit arrangement of any one of Examples 70 to 88.

All acronyms defined in the above description additionally hold in all claims included herein.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:
1. A signal processing circuit arrangement comprising:
a preamplifier circuit configured to:
map a first dimension input and a second dimension input to a first subset of a plurality of lookup table coefficients of a two-dimensional (2D) lookup table, wherein the first dimension input and the second dimension input each represent a signal level of one or more input signals;
extrapolate from the first subset of the plurality of lookup table coefficients to generate a lookup table output; and apply the lookup table output to the one or more input signals to generate a predistorted input signal for an amplifier;
a feedback circuit configured to monitor an output signal of the amplifier; and
an adaptation circuit configured to adapt the plurality of lookup table coefficients based on the output signal of the amplifier,
wherein the preamplifier circuit is further configured to assign each of a plurality of predefined regions of the 2D lookup table as an interpolation region or an extrapolation region, and to reassign at least one of the plurality of predefined regions of the 2D lookup table.

2. The signal processing circuit arrangement of claim 1, further comprising the amplifier.

3. The signal processing circuit arrangement of claim 2, further comprising a mixing circuit configured to modulate the predistorted input signal with a radio frequency signal to obtain a modulated predistorted input signal,
wherein the amplifier is configured to amplify the predistorted input signal.

4. The signal processing circuit arrangement of claim 1, wherein the first dimension input represents a real part of a first complex sample of a first input signal of the one or more input signals and the second dimension input represents an imaginary part of the first complex sample of the first input signal.

5. The signal processing circuit arrangement of claim 1, wherein the first dimension input represents a signal level of a first input signal of the one or more input signals and the second dimension input represents a signal level of a second input signal of the one or more input signals.

6. The signal processing circuit arrangement of claim 1, wherein the preamplifier circuit is further configured to generate one or more additional lookup table outputs from one or more additional 2D lookup tables.

7. The signal processing circuit arrangement of claim 6, wherein the preamplifier circuit is configured to apply the lookup table output to the one or more input signals to generate the predistorted input signal for the amplifier by:
identifying one or more input samples of the one or more input signals;
evaluating one or more functions of the one or more input samples to obtain one or more function outputs; and
determining one or more intermediate products by multiplying each of the one or more function outputs by a respective lookup table output of the one or more additional lookup table outputs; and
generating the predistorted input signal for the amplifier as a sum of the one or more intermediate products.

8. The signal processing circuit arrangement of claim 7, wherein each of the one or more input samples are samples of a first input signal of the one or more input signals.

9. The signal processing circuit arrangement of claim 7, wherein the one or more input samples comprise input samples of a first input signal of the one or more input signals and a second input signal of the one or more input signals.

10. The signal processing circuit arrangement of claim 9, wherein the amplifier is a dual-band amplifier, and wherein the first input signal corresponds to a first frequency band of the dual-band amplifier and the second input signal corresponds to a second frequency band of the dual-band amplifier.

11. The signal processing circuit arrangement of claim 1, wherein the preamplifier circuit is further configured to:
map the first dimension input and the second dimension input to one or more additional 2D lookup tables;
interpolate or extrapolate with the one or more additional 2D lookup tables to generate one or more additional lookup table outputs,
wherein the preamplifier circuit is configured to apply the lookup table output to the one or more input signals to generate the predistorted input signal for the amplifier by:
combining the lookup table output and the one or more additional lookup table outputs to generate the predistorted input signal.

12. The signal processing circuit arrangement of claim 1, wherein a point formed by the first dimension input and the second dimension input falls within an extrapolation region.

13. The signal processing circuit arrangement of claim 1, wherein the preamplifier circuit is configured to reassign the at least one of the plurality of predefined regions of the 2D lookup table by:
monitoring a plurality of pairs of first dimension inputs and second dimension inputs received for the 2D lookup table; and
reassigning a first region of the plurality of predefined regions as an interpolation region if more than a predefined quantity of the plurality of pairs fall within the first region and reassigning the first region as an extrapolation region if less than the predefined quantity of the plurality of pairs fall within the first region.

14. A signal processing circuit arrangement comprising:
a first DPD circuit configured to:
map a first dimension input and a second dimension input to one or more first two-dimensional (2D) lookup tables, wherein the first dimension input represents a signal level of a first input signal and the second dimension input represents a signal level of a second input signal, and to extrapolate from lookup table coefficients of a first 2D lookup table of the one or more first 2D lookup tables to obtain a first intermediate signal;
a second DPD circuit configured to:
map the first dimension input and the second dimension input to one or more second 2D lookup tables, and to interpolate or extrapolate with lookup table coefficients of the one or more second 2D lookup tables to obtain a second intermediate signal;
a combination circuit configured to combine the first intermediate signal and the second intermediate signal to obtain a predistorted input signal for an amplifier;
a feedback circuit configured to monitor an output signal of the amplifier; and
an adaptation circuit configured to adapt the plurality of lookup table coefficients based on the output signal of the amplifier,
wherein the first DPD circuit is further configured to assign each of a plurality of regions of a first 2D lookup table of the one or more first 2D lookup tables as an interpolation region or an extrapolation region, and to reassign at least one of the plurality of predefined regions of the first 2D lookup table.

15. The signal processing circuit arrangement of claim 14, further comprising the amplifier.

16. The signal processing circuit arrangement of claim 14, wherein the combination circuit is configured to combine the first intermediate signal and the second intermediate signal to obtain the predistorted input signal by:

upsampling and upconverting the first intermediate signal and the second intermediate signal to obtain a first resulting signal and a second resulting signal; and summing the first resulting signal and the second resulting signal to obtain the predistorted input signal.

17. The signal processing circuit arrangement of claim 14, wherein the first DPD circuit is configured to extrapolate from the lookup table coefficients of the first 2D lookup table of the one or more first 2D lookup tables to obtain the first intermediate signal by:

generating a lookup table output from each of the one or more first 2D lookup tables to obtain one or more lookup table outputs;

identifying one or more samples of the first input signal and the second input signal;

evaluating one or more functions of the one or more samples to obtain one or more function outputs;

determining one or more intermediate products by multiplying each of the one or more function outputs by a respective lookup table output of the one or more lookup table outputs;

generating the first intermediate signal as a sum of the one or more intermediate products.

18. The signal processing circuit arrangement of claim 14, wherein the second DPD circuit is configured to interpolate or extrapolate with the lookup table coefficients of the one or more second 2D lookup tables to obtain the second intermediate signal by:

generating a lookup table output from each of the one or more second 2D lookup tables to obtain one or more lookup table outputs;

identifying one or more samples of the first input signal and the second input signal;

evaluating one or more functions of the one or more samples to obtain one or more function outputs;

determining one or more intermediate products by multiplying each of the one or more function outputs by a respective lookup table output of the one or more lookup table outputs;

generating the second intermediate signal as a sum of the one or more intermediate products.

19. The signal processing circuit arrangement of claim 14, wherein the amplifier is a dual-band radio amplifier and the first input signal corresponds to a first frequency band of the amplifier and the second input signal corresponds to a second frequency band of the amplifier.

20. A method of preprocessing amplifier input signals, the method comprising:

mapping a first dimension input and a second dimension input to a first subset of a plurality of lookup table coefficients of a two-dimensional (2D) lookup table, wherein the first dimension input and the second dimension input each represent a signal level of one or more input signals;

extrapolating from the first subset of the plurality of lookup table coefficients to generate a lookup table output;

applying the lookup table output to the one or more input signals to generate a predistorted input signal for an amplifier;

monitoring an output signal of the amplifier;

adapting the plurality of lookup table coefficients based on the output signal of the amplifier;

assigning each of a plurality of predefined regions of the 2D lookup table as an interpolation region or an extrapolation region; and reassigning at least one of the plurality of predefined regions of the 2D lookup table.

21. The method of claim 20, further comprising:

generating one or more additional lookup table outputs from one or more additional 2D lookup tables.

22. The method of claim 21, wherein applying the lookup table output to the one or more input signals to generate the predistorted input signal for the amplifier comprises:

identifying one or more input samples of the one or more input signals;

evaluating one or more functions of the one or more input samples to obtain one or more function outputs; and determining one or more intermediate products by multiplying each of the one or more function outputs by a respective lookup table output of the one or more additional lookup table outputs; and generating the predistorted input signal for the amplifier as a sum of the one or more intermediate products.

* * * * *